United States Patent
Lin et al.

(10) Patent No.: US 11,646,266 B2
(45) Date of Patent: May 9, 2023

(54) HELMET STRUCTURES FOR SEMICONDUCTOR INTERCONNECTS

(71) Applicant: INTEL CORPORATION, Santa Clara, CA (US)

(72) Inventors: Kevin Lai Lin, Beaverton, OR (US); Miriam Ruth Reshotko, Portland, OR (US); Nafees Aminul Kabir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 750 days.

(21) Appl. No.: 16/535,539

(22) Filed: Aug. 8, 2019

(65) Prior Publication Data
US 2021/0043565 A1 Feb. 11, 2021

(51) Int. Cl.
*H01L 23/528* (2006.01)
*H01L 23/532* (2006.01)
*H01L 23/522* (2006.01)

(52) U.S. Cl.
CPC ...... *H01L 23/5283* (2013.01); *H01L 23/5226* (2013.01); *H01L 23/53295* (2013.01)

(58) Field of Classification Search
CPC ......... H01L 21/76897; H01L 21/76801; H01L 21/76832; H01L 23/49827
See application file for complete search history.

(56) References Cited

U.S. PATENT DOCUMENTS

| | | | | |
|---|---|---|---|---|
| 6,509,623 | B2* | 1/2003 | Zhao | H01L 23/5329 257/E21.573 |
| 2003/0183940 | A1* | 10/2003 | Noguchi | H01L 23/53295 257/E21.589 |
| 2016/0211211 | A1* | 7/2016 | Yim | H01L 21/76831 |
| 2018/0130697 | A1* | 5/2018 | Jang | H01L 21/76843 |
| 2019/0157214 | A1* | 5/2019 | Kim | H01L 23/5226 |

* cited by examiner

*Primary Examiner* — Changhyun Yi
(74) *Attorney, Agent, or Firm* — Schwabe, Williamson & Wyatt, P.C.

(57) ABSTRACT

Interconnect structures are disclosed. An example includes conductive traces over a first dielectric layer, dielectric helmet structures over top surfaces of the conductive traces, and a second dielectric layer over the helmet structures. Spaces between adjacent ones of conductive traces are devoid of material. A bottom surface of the second dielectric layer is between top surfaces of the dielectric structures and bottom surfaces of the helmet structures, or co-planar with the top surface of the helmet structures, but the airgap extends above tops of the conductive traces. Another example includes a dielectric adjacent to upper sections but not lower sections of conductive traces, so as to provide airgaps between adjacent lower sections. Alternatively, a first dielectric material is adjacent the upper sections and a second compositionally different dielectric material is adjacent the lower sections. In either case, the sidewalls of the upper sections of the interconnect features may include scalloping.

23 Claims, 25 Drawing Sheets

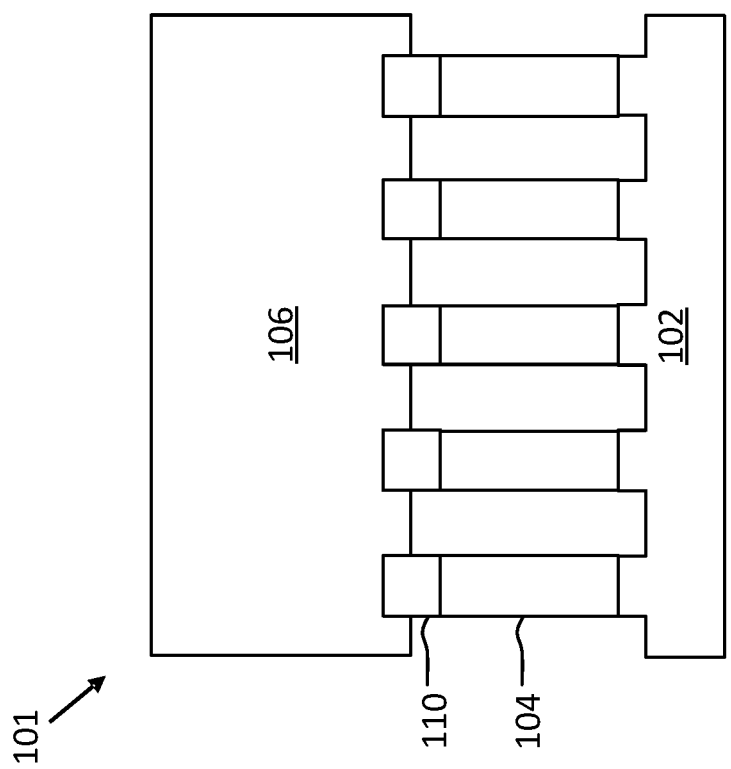
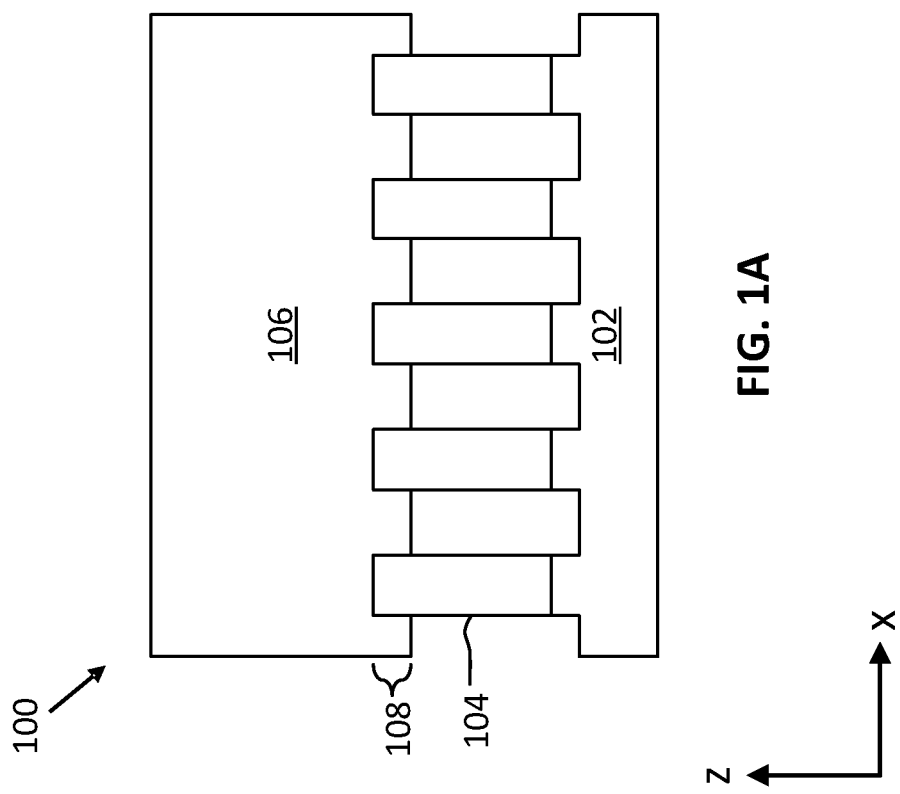

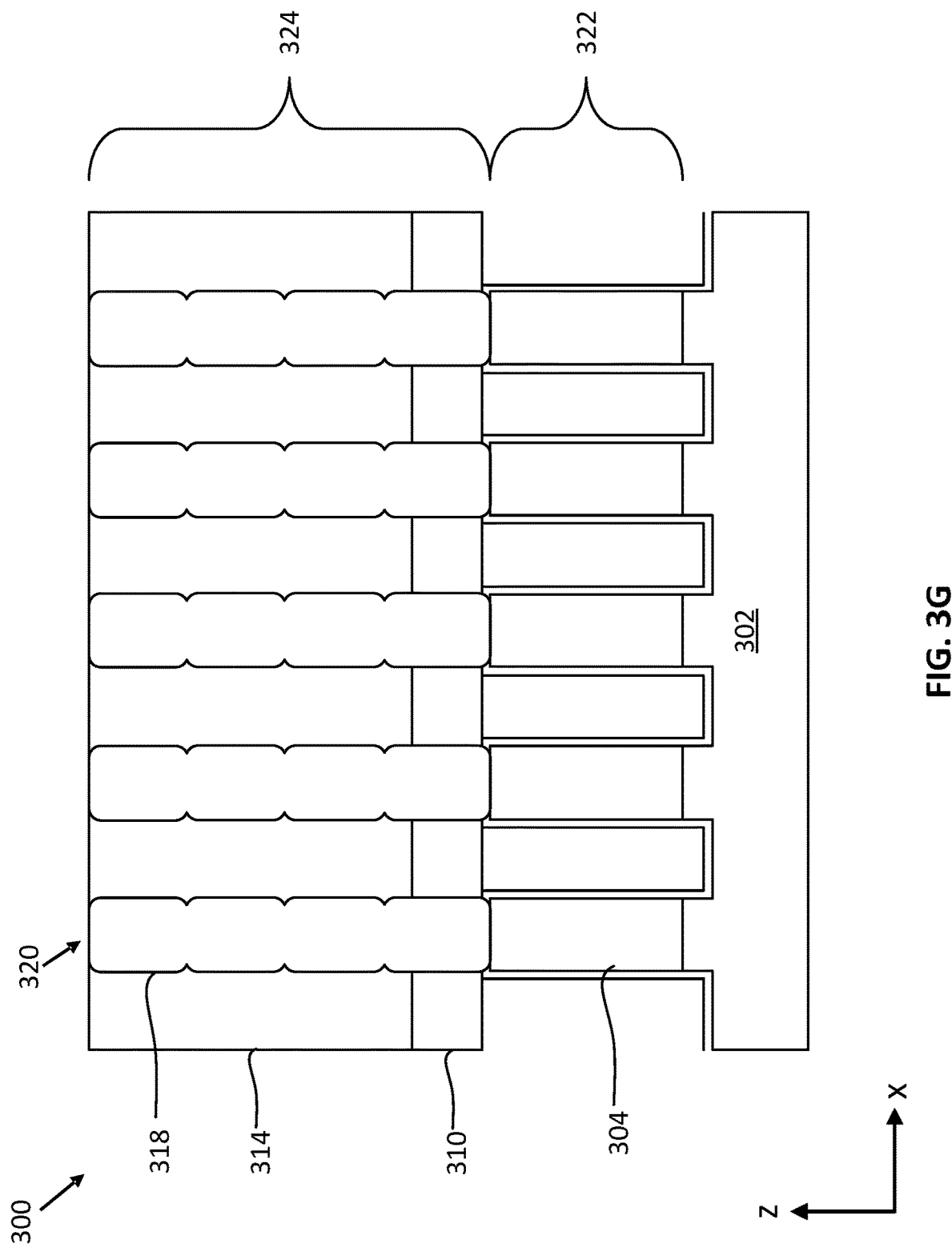

HELMET STRUCTURES FOR SEMICONDUCTOR INTERCONNECTS

BACKGROUND

As electronic devices continue to become smaller and more complex, the need to provide more densely packed interconnects similarly grows. Interconnects are conductive structures that connect two or more circuit elements (such as transistors) together electrically. The design and layout of interconnects on an integrated circuit (IC) can be important to the proper function and performance of the IC. Interconnects typically are fabricated along a series of levels above the substrate surface (or device layer, as the case may be) and can be connected using conductive vias that pass between two or more of the levels. There are numerous design factors to consider when fabricating interconnects to ensure proper isolation and sufficiently low resistance among the interconnects.

BRIEF DESCRIPTION OF THE DRAWINGS

Features and advantages of embodiments of the claimed subject matter will become apparent as the following Detailed Description proceeds, and upon reference to the Drawings, in which:

FIG. 1A illustrates a cross-section view of an integrated circuit structure that includes an interconnect structure.

FIG. 1B illustrates a cross-section view of an integrated circuit structure that includes an example interconnect structure configured with dielectric helmet structures on elongated conductive features, in accordance with some embodiments of the present disclosure.

FIGS. 3A-3G illustrate cross-section views of different stages in a fabrication process for an integrated circuit structure that includes another example interconnect structure configured with high aspect ratio conductive features, in accordance with some embodiments of the present disclosure.

Figure 2A:
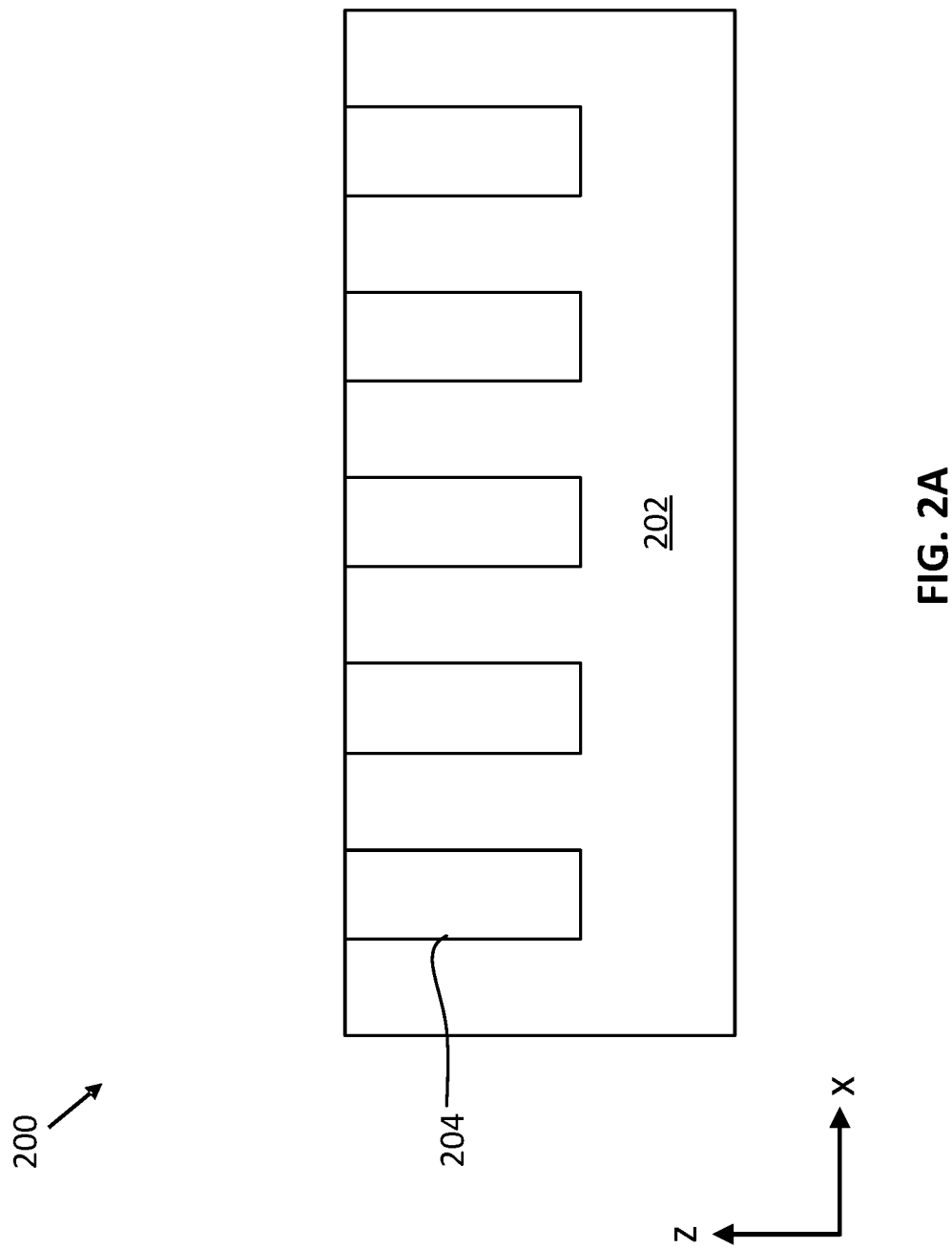
FIGS. 2A-2E illustrate cross-section views of different stages in a fabrication process for the integrated circuit structure that includes the interconnect structure of FIG. 1B, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Interconnect structures are disclosed. An example structure includes conductive traces over a first dielectric layer, dielectric helmet structures over top surfaces of the conductive traces, and a second dielectric layer over the helmet structures. The first and second dielectric layers may be the same or different materials, and the helmet structures can be a material that selectively deposits onto the conductive traces, according to an embodiment. Spaces between adjacent ones of conductive traces are devoid of material, so as to provide an airgap or void (open space with or without gas). A bottom surface of the second dielectric layer is between top surfaces of the dielectric structures and bottom surfaces of the helmet structures, or co-planar with the top surface of the helmet structures. In any such cases, the airgap extends above tops of the conductive traces. Another example includes a dielectric material adjacent to upper sections of conductive traces but not the lower sections of conductive traces, so as to provide airgaps between adjacent lower sections. Alternatively, a first dielectric material is adjacent the upper sections and a second dielectric material is adjacent the lower sections. In either case, the sidewalls of the upper sections of the interconnect features may include scalloping, such that the profile of the upper sections of the conductive traces and the adjacent first dielectric material include a vertical series of complementary concave and convex shapes (or complementary dimples and protuberances, as the case may be). Numerous embodiments and variations will be appreciated in light of this disclosure.

General Overview

As previously explained, fabricating interconnects involves a number of non-trivial issues. For instance, there must be sufficient electrical isolation between laterally adjacent interconnect features. Likewise, there must be sufficiently low resistance along an interconnect structure. For instance, while airgaps (open space with or without gas) may provide very good electrical isolation between adjacent metal lines, it is difficult to control the placement of an airgap with respect to metal lines. If the dielectric material intrudes into the airgap between the lines, then line-to-line capacitance increases. Such increased capacitance and the performance degradation associated therewith may not be acceptable in all applications. One possible solution is to use a non-optimal dielectric material (e.g., low viscosity) that is less likely to intrude into the open space, but such poor gap fill materials may also introduce other problems (e.g., such as poor gap fill in other gaps where fill is actually desired). Another issue associated with interconnects is with respect to high aspect ratio features, such as relatively tall metal lines or interconnect features that have a dielectric material therebetween, or relatively tall dielectric features that have a conductive material therebetween. Hard masks are helpful in many high aspect ratio etch processes, as they protect one material while a laterally adjacent material is etched away to form relatively high aspect ratio features. When forming such tall high aspect ratio features, hard masks tend to wear thin and thus need to be very thick or otherwise replenished. Unfortunately, thick hardmasks tend to be susceptible to so-called breadloafing and therefore pinch-off and effectively block the trench from being etched. So, a thinner hard mask must be used and replenished during the etch process.

Thus, interconnect structures are disclosed herein that address such issues, according to some embodiments. The interconnect structures utilize deposited dielectric material in the form of cap or "helmet" structures. The helmet structures can be used, for instance, to reduce parasitic capacitance between adjacent interconnects by increasing airgap space between those interconnects, and/or to produce higher-aspect ratio interconnects. A number of use cases will be appreciated in light of this disclosure.

For instance, an example interconnect structure according to some embodiments includes dielectric helmet structures on the top surfaces of metal interconnects to provide a height buffer for a compositionally distinct dielectric layer deposited over the dielectric helmet structures. In particular, the helmet structures are used to ensure that the dielectric layer remains above the metal interconnects, leaving an airgap or void (open space with or without gas) between the interconnects. In some such embodiments, the top surface of the airgap or void is above or otherwise extends beyond the tops of the adjacent metal interconnects, thereby increasing the airgap. Without the helmet structures, the second dielectric layer may creep past the tops of the underlying metal interconnects so as to be laterally between the adjacent metal interconnects and close off or fill the upper portion of the airgap, thereby reducing the size of the airgap. By maximizing or otherwise increasing the airgap between adjacent metal line or interconnect features, the line-to-line (or feature-to-feature) capacitance between adjacent metal interconnects is reduced, as will be appreciated. In another example use case, dielectric helmet structures are sequentially deposited and shaped in a vertical stack on the top surfaces of metal interconnects (or on top surfaces of dielectric material between the metal interconnects) to form vertical stacks of dielectric helmet structures. In some such embodiments, the vertical stack has sidewalls that have a cross-sectional profile which includes a convex-like pattern that repeats down the length of the sidewalls (one convex pattern for each dielectric helmet structure in the stack). In particular, there are inward-facing dimples where one dielectric helmet structure interfaces with the next dielectric helmet structure in the vertical stack. The resulting stacked dielectric helmet structures can be used as a relatively tall hard mask, to facilitate high aspect ratio etching of material between the helmet structures. In other such example use cases, once the vertical stack of dielectric helmet structures has reached a desired height, the vertical stack of dielectric helmet structures can be removed and replaced with another material based on the application to form high-aspect ratio structures (conductive or dielectric). In such cases, note that the material that is deposited into the space previously occupied by the stack of dielectric helmet structures takes on the convex-like profile. Further note that any fill material deposited immediately adjacent to the stack of dielectric helmet structures takes on a concave-like sidewall profile that is complementary to the convex-like sidewall profile of the stack of dielectric helmet structures. In particular, the sidewall of the fill material has outward-facing protuberances that extend into the dimples where one dielectric helmet structure interfaces with the next dielectric helmet structure in the vertical stack, as will be appreciated.

According to some example embodiments, an interconnect structure includes a plurality of conductive traces over a first dielectric layer, dielectric cap or helmet structures over top surfaces of the conductive traces, and a second dielectric layer over the dielectric helmet structures. The conductive traces are arranged in a lateral sequence. Spaces between adjacent ones of the conductive traces are devoid of material, so as to provide an airgap or void (space with or without gas). In some such embodiments, a bottom surface of the second dielectric layer is between top and bottom surfaces of the dielectric helmet structures. In other such embodiments, the bottom surface of the second dielectric layer is co-planar with the top surface of the dielectric helmet structures. In any case, the airgap extends vertically past the tops of the corresponding adjacent conductive traces, such that there is no portion of the second layer closing off a portion of the airgap this is laterally between those conductive traces. The first dielectric and second dielectric layers may be the same material (e.g., silicon oxide) or different materials (e.g., silicon oxide and silicon carbide), and the helmet structures can be a material that selectively deposits onto the conductive traces, according to an embodiment.

According to another example embodiment, an interconnect structure includes a plurality of conductive traces over a dielectric layer, arranged in a lateral sequence. The plurality of conductive traces includes conductive traces that each have a first section and a second section arranged in a vertical stack, wherein the first section is closer to the dielectric layer. The interconnect structure also includes a dielectric material laterally adjacent to the second sections of the plurality of the conductive traces. The dielectric material is not laterally adjacent to the first sections of the plurality of the conductive traces, so as to provide an airgap or void (space with or without air) between laterally adjacent first sections of the conductive traces. In some such cases, note that the sidewalls of the second sections of the conductive traces may include scalloping or a convex-like profile, as previously explained. In such cases, further note that the sidewalls of the dielectric material laterally adjacent to the second sections of the conductive traces may include a concave-like profile that corresponds to or is otherwise complementary to the scalloping or convex-like profile of the laterally adjacent second sections of the conductive traces. Such scalloping and concave/convex profiles are examples of structural features indicative that a helmet-based forming methodology according to some embodiments was utilized, as will be appreciated.

In still other embodiments, an interconnect structure includes a plurality of conductive traces over a dielectric layer, arranged in a lateral sequence. The plurality of conductive traces includes conductive traces that each have a first section and a second section arranged in a vertical stack, wherein the first section is closer to the dielectric layer. The interconnect structure also includes a first dielectric material laterally adjacent to the first sections of the conductive traces and a second dielectric material laterally adjacent to the second sections of the conductive traces. So, there are no intentional airgaps between laterally adjacent one of the conductive traces. In some such cases, note that the sidewalls of second dielectric material adjacent the second sections of conductive traces may include scalloping or a convex-like profile, as previously explained. In such cases, further note that the sidewalls of the second sections of conductive traces laterally adjacent to the second dielectric material may include a concave-like profile that corresponds to or is otherwise complementary to the scalloping or convex-like profile of the laterally adjacent second dielectric material. Such scalloping and concave/convex profiles are examples of structural features indicative that a helmet-based forming methodology according to some embodiments was utilized, as will be appreciated.

Note that the term airgap as used herein is not intended to be limited to an air-filled space or any specific gas; rather, an airgap may be filled with any number of gases (e.g., nitrogen, helium, oxygen, argon, and/or other gas), or may be devoid of gas (vacuum). Thus, the term airgap as used herein is intended to include all such spaces, unless expressly indicated otherwise (such as an airgap containing oxygen and nitrogen, or an airgap containing air).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of the dielectric helmet structures to vertically extend the top surface of an airgap between adjacent interconnects to be higher than the stop surfaces of those adjacent interconnects. In some other example embodiments, such tools may indicate the presence of scalloping or an otherwise unusual profile (e.g., vertically repetitive convex-like pattern (inward facing dimples) or concave-like pattern (outward facing protuberances) that extends along a portion of the sidewalls of conductive and insulative interconnect features consistent with a forming methodology that utilizes stacked dielectric helmet structures as variously provided herein. Numerous configurations and variations will be apparent in light of this disclosure.

Materials that are "compositionally different" or "compositionally distinct" as used herein refers to two materials that have different chemical compositions. This compositional difference may be, for instance, by virtue of an element that is in one material but not the other (e.g., silicon oxide is compositionally different from silicon nitride), or by way of one material having all the same elements as a second material but at least one of those elements is intentionally provided at a different concentration in one material relative to the other material (e.g., silicon germanium having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer or other suitable technique.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 2" may be used to refer to the collection of drawings of FIGS. 2A-2E, the phrase "FIG. 3" may be used to refer to the collection of drawings of FIGS. 3A-3G, and the phrase "FIG. 4" may be used to refer to the collection of drawings of FIGS. 4A-4H.

It should be readily understood that the meaning of "above" and "over" in the present disclosure should be interpreted in the broadest manner such that "above" and "over" not only mean "directly on" something but also include the meaning of over something with an intermediate feature or a layer therebetween.

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which one or more subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer. In still other embodiments, a substrate may include multiple layers, such as a base layer (e.g., bulk silicon wafer), a single crystalline top layer (e.g., monocrystalline silicon), and a buried insulator layer (e.g., silicon dioxide) between the base and top layers. As will be appreciated, any number of substrate configurations can be used with the techniques provided herein.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Architecture

FIG. 1A illustrates a portion of an IC having an example interconnect structure that is susceptible to additional parasitic capacitance between adjacent interconnects. Interconnect structure 100 includes a first dielectric layer 102, a plurality of conductive traces 104, and a second dielectric layer 106. The conductive traces 104 are effectively arranged in a lateral sequence, and provide interconnects that may run in various directions along the X-Y plane to carry signals around the IC. For ease of illustration, parallel interconnects running along the Y-direction are shown.

Further note that the conductive traces 104 may be coupled to contacts, electrodes or terminals of components (e.g., transistors, diodes, resistors, capacitors, inductors), or to vias or other conductive lines or features, as will be appreciated. For instance, first dielectric layer 102 may further include a number of local interconnect features that couple the conductive traces 104 to transistors and/or other components of an underlying device layer. Further note that the conductive traces 104 may be may have a consistent pitch along the sequence or a pitch that varies. To this end, the conductive traces 104 are shown as all having the same width and spacing (e.g., within 0.5 or 1 nm of each other), but they may have varying widths and/or spacing in other embodiments. Likewise, the conductive traces are all shown as having substantially the same height (e.g., within 0.5 or 1 nm of each other), but they may have varying heights in other embodiments. Any such conductive trace patterns within a given interlayer dielectric (ILD) structure may generally be referred to as a lateral sequence of conductive traces, as they are laterally adjacent to one another and an imaginary horizontal line passes through all the conductive traces of a given lateral sequence.

As can be further seen in FIG. 1A, an airgap exists between adjacent ones of plurality of conductive traces 104 and sandwiched between first dielectric layer 102 and second dielectric layer 106. However, further note that the second dielectric layer 106 exhibits an overhang 108 that covers a portion of plurality of conductive traces 104. As a result, the airgap does not extend the entire height of conductive traces 104 and the capacitance is increased due to the presence of second dielectric layer 106 between adjacent ones of the conductive traces 104 (since the material of second dielectric layer 106 would have a dielectric constant higher than that of the airgap).

FIG. 1B illustrates a portion of an IC having an interconnect structure configured with helmet structures, according to an embodiment of the present disclosure. In particular, interconnect structure 101 includes a plurality of helmet structures 110 on the top surfaces of conductive traces 104. The previous discussion with respect to the lateral sequence nature of conductive traces 104 as well as the geometry and spacing of conductive traces 104 is equally applicable here. Helmet structures 110 effectively act as a height buffer between conductive traces 104 and second dielectric layer 106. Due to the extended height caused by helmet structures 110, second dielectric layer 106 does not deposit on or between any portion of conductive traces 104. It should be noted that this is an ideal case and that, in most practical applications, a negligible amount of second dielectric layer 106 may deposit between adjacent conductive traces 104, however, it will not completely fill any portion between adjacent conductive traces 104 so as to reduce the height of the airgaps. As a result, at least a portion of the airgap between adjacent ones of conductive traces 104 extends the entire height of conductive traces 104, and the line-to-line capacitance can be minimized or otherwise reduced, relative to a configuration such as the one shown in FIG. 1A.

According to some embodiments, the regions between adjacent ones of conductive traces 104 is filled with a dielectric material having a low dielectric constant (e.g., lower than the dielectric constant of each of first dielectric layer 102 and second dielectric layer 106.) Using the low-k dielectric material between conductive traces 104 does not reduce the parasitic capacitance as much as using an airgap, but it may be more feasible and/or compatible when fabricating certain devices.

Other fabrication techniques using similar dielectric helmet structures are also disclosed that yield high-aspect ratio conductive traces. Forming such high-aspect ratio traces can be beneficial for lowering the line resistance while maintaining a high packing density of interconnect lines on a given interconnect level. Example such configurations will be discussed in turn.

Interconnect Fabrication

FIGS. 2A-2E illustrate cross-section views of a portion of an IC that includes an interconnect structure 200, according to an embodiment. Note that some intermediate processes may be performed that are not explicitly illustrated, as will be appreciated (e.g., such as polishing and cleaning processes, or other standard processing). In other embodiments, not all illustrated layers are used and/or additional layers may be included. For instance, lower dielectric or device layers may also be included, as will be further appreciated.

FIG. 2A illustrates a first dielectric layer 202 and a plurality of conductive traces 204 patterned in first dielectric layer 202. Conductive traces 204 may be formed using standard lithography processes (such as a damascene or dual damascene process) to fill trenches within first dielectric layer 202 with a conductive material, such as when forming vias and lines within an ILD structure. Conductive traces 204 may include a metal or metal alloy. Some examples of conductive materials to use for conducive traces 204 include titanium nitride (TiN), titanium silicon nitride (TiSiN), tantalum nitride (TaN), titanium aluminum carbon nitride (TiAlCN), polysilicon (pSi), copper (Cu), aluminum (Al), gold (Au), tungsten (W), cobalt (Co), platinum (Pt), ruthenium (Ru), and iridium (Ir). First dielectric layer 202 may be any suitable interlayer dielectric (ILD) material. Examples of ILD materials include silicon oxide, silicon nitride, silicon oxynitride, polymers, and low-k dielectrics (e.g., porous versions of any of these). First dielectric layer 202 may be deposited using, for example, physical vapor deposition (PVD) or chemical vapor deposition (CVD) techniques.

Although not illustrated, first dielectric layer 202 may be deposited over a substrate or device layer, such as a semiconductor substrate populated with complementary metal oxide semiconductor (CMOS) transistor based logic circuitry and/or radio frequency (RF) power transistors and filters. The substrate may be any suitable substrate material for forming additional material layers over it (e.g., bulk semiconductor substrate or a semiconductor-on-insulator substrate). In some embodiments, the substrate includes a semiconductor material such as silicon, germanium, silicon germanium, gallium arsenide, or indium phosphide. First dielectric layer 202 may be deposited directly on a surface of the substrate, or in other embodiments, first dielectric layer 202 is deposited over one or more other dielectric layers between it and the underlying substrate.

Figure 2B:
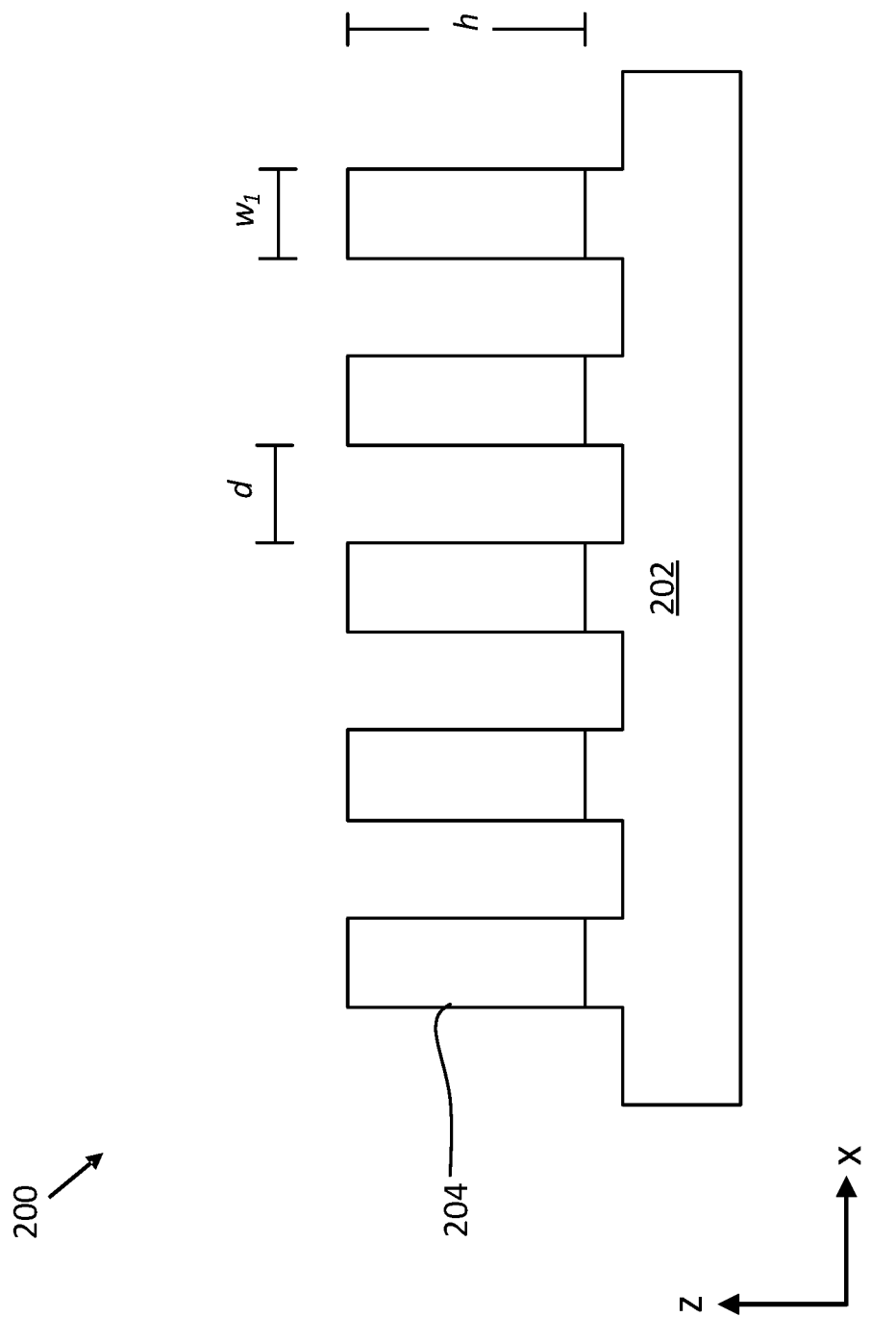

FIG. 2B illustrates a further progression in the fabrication of interconnect structure 200 where portions of first dielectric layer 202 have been removed from between adjacent ones of the conductive traces 204. In some embodiments, first dielectric layer 202 is etched using a reactive ion etching (RIE) process or wet chemical etchants, although any suitable etch scheme can be used. First dielectric layer 202 may be etched such that the layer is recessed below the bottom surfaces of conductive traces 204, thus exposing the entire height h of conductive traces 204. In some other example embodiments, first dielectric layer 202 is recessed less than the entire height h of conductive traces 204, such that lower portions of conductive traces 204 are still surrounded by first dielectric layer 202. According to some example embodiments, height h of conductive traces 204 is between about 25 nm and about 250 nm, or between about 75 nm and about 100 nm; a width $w_1$ of each of conductive traces 204 may be between about 15 nm and about 80 nm; and a distance d between adjacent ones of conductive traces 204 may be between about 15 nm and about 80 nm. In one such example case, conductive traces 204 have a pitch of between about 30 nm and about 160 nm. In a more general sense, the geometry of the conductive traces and spacing therebetween can vary from one embodiment to the next, and the present disclosure is not intended to be limited to any such geometries.

Figure 2C:
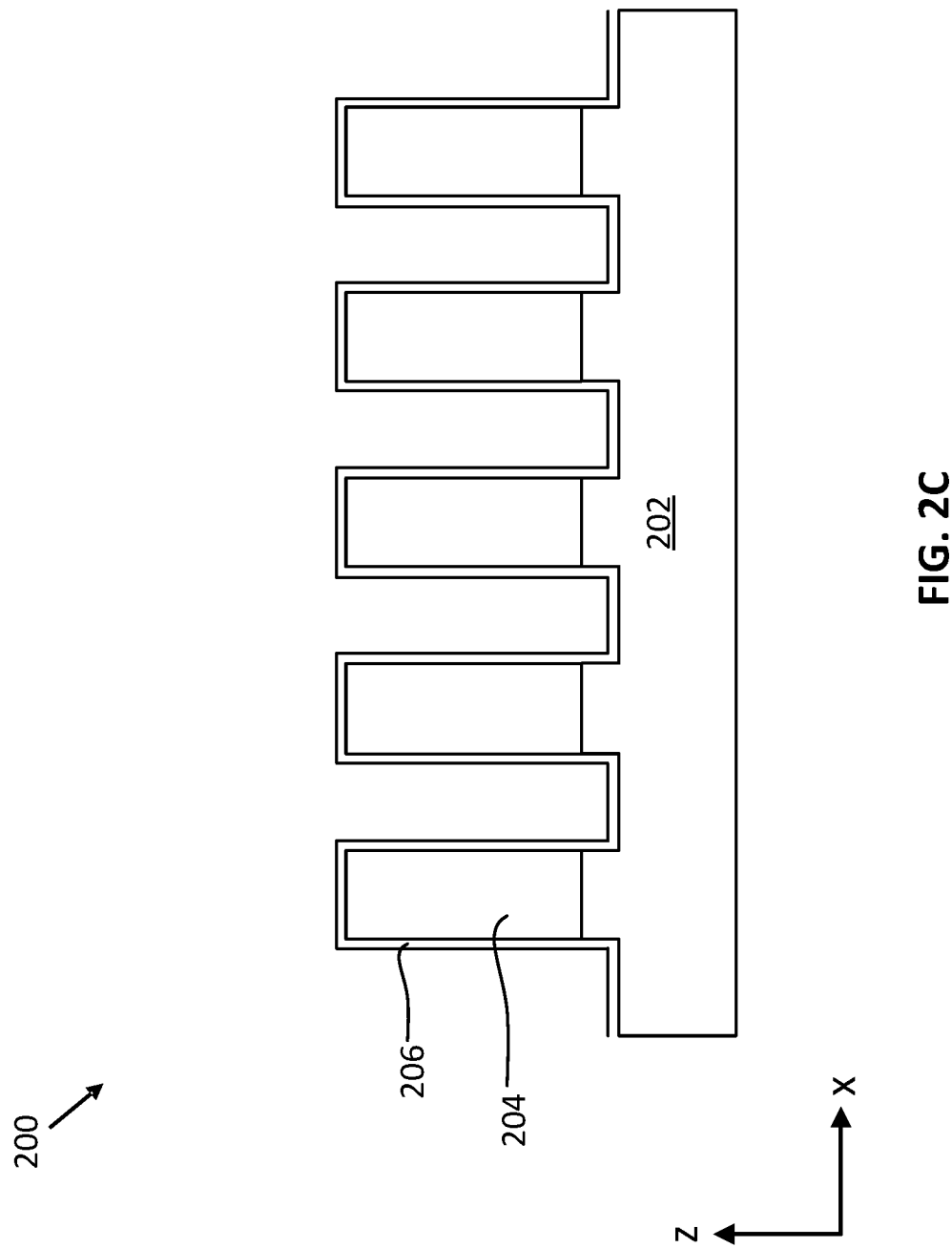

FIG. 2C illustrates a further progression in the fabrication of interconnect structure 200 where a layer 206 is deposited over conductive traces 204, according to some embodiments. Layer 206, when present, may be conformally deposited to cover the top surfaces and sidewall surfaces of conductive traces 204, according to one such embodiment. Layer 206 may be provided, for example, to protect conductive traces 204 from unwanted oxidation, and/or as an etch stop, and/or as a barrier layer (e.g., to prevent electromigration of metal from conductive traces 204 into adjacent materials). According to some embodiments, layer 206 is deposited relatively thin (e.g., less than 5 nm thick or less than 1 nm thick, although other embodiments may include a thicker layer 206), using CVD, atomic layer deposition (ALD), or other suitable deposition technique. Layer 206 may include any number of materials, such as silicon nitride, silicon carbide, silicon oxynitride, silicon oxynitride carbide, tantalum, or tantalum nitride. In some other embodiments, another dielectric material having a lower dielectric constant than that of first dielectric layer 202 is deposited between adjacent ones of conductive traces 204. When filling the regions between conductive traces 204 with the dielectric material, layer 206 is not needed.

Figure 2D:
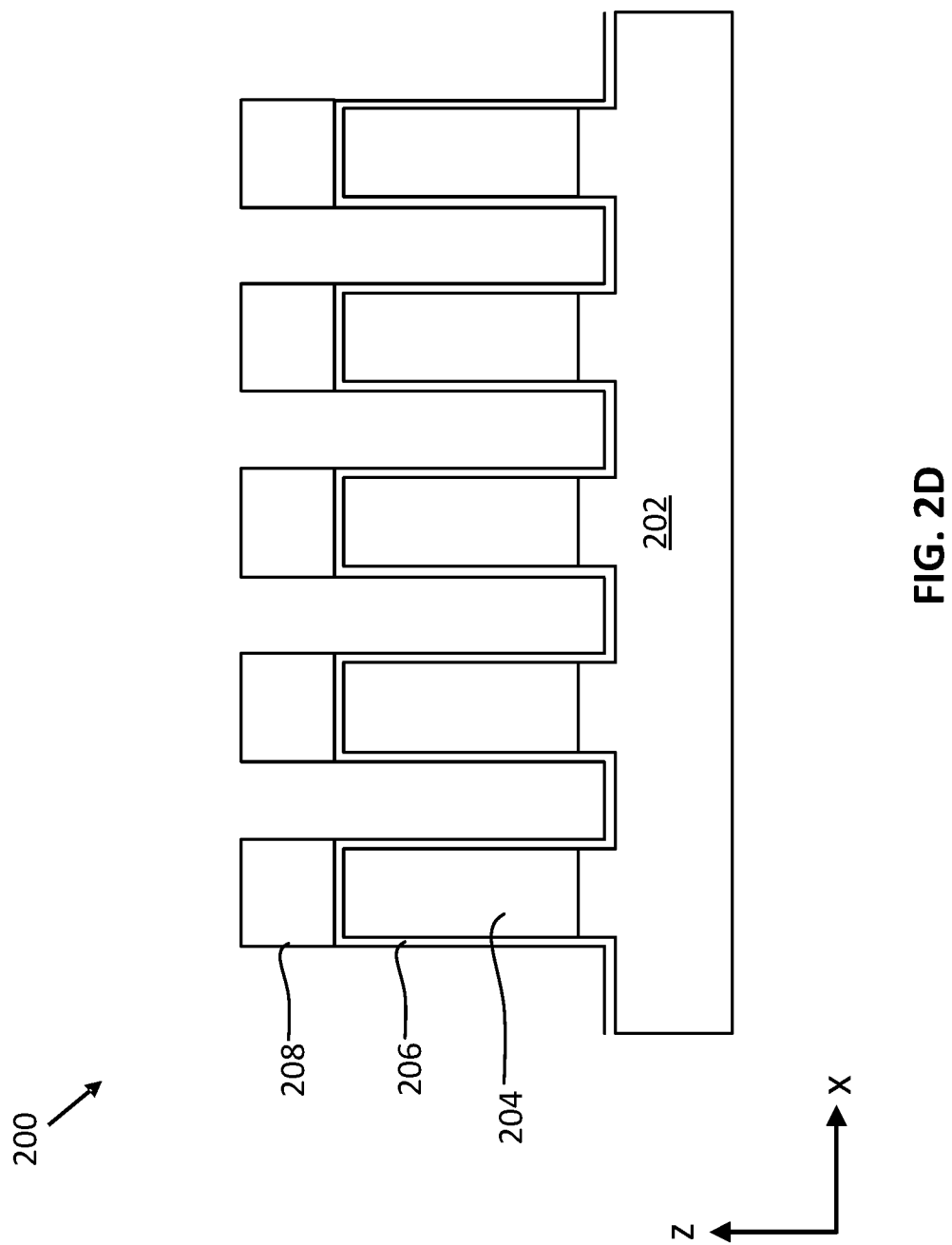

FIG. 2D illustrates a further progression in the fabrication of interconnect structure 200 where caps or helmet structures 208 are deposited over top surfaces of conductive traces 204. According to some embodiments, helmet structures 208 include a dielectric material and are deposited using a PVD process, although other suitable deposition techniques can be used that can selectively deposit on the tops of conductive traces 204, such as CVD where reactant species is available at the top surface of conductive traces 204 where growth is desired. In some examples, helmet structures 208 are amorphous silicon or titanium nitride or a low-k material such as porous silicon oxide, although other materials can be used that can be selectively deposited on the tops of conductive traces 204, as will be appreciated. The PVD or other selective deposition technique is used to maximize the deposition of helmet structures 208 over the top surfaces of conductive traces 204, while minimizing deposition between conductive traces 204. In some embodiments, one or more adjacent helmet structures 208 connect together over conductive traces 204. In some embodiments, helmet structures 208 have rounded edges, producing a curved top surface rather than the illustrated flat top surface, which may also manifest as curved sidewalls. Helmet structures 208 may be deposited to any desired thickness, so long as the deposition does not cause helmet structures 208 to deposit substantially along any portion of the sidewalls of conductive traces 204. In some example embodiments, helmet structures 208 have a thickness between about 5 nm and about 50 nm.

Figure 2E:
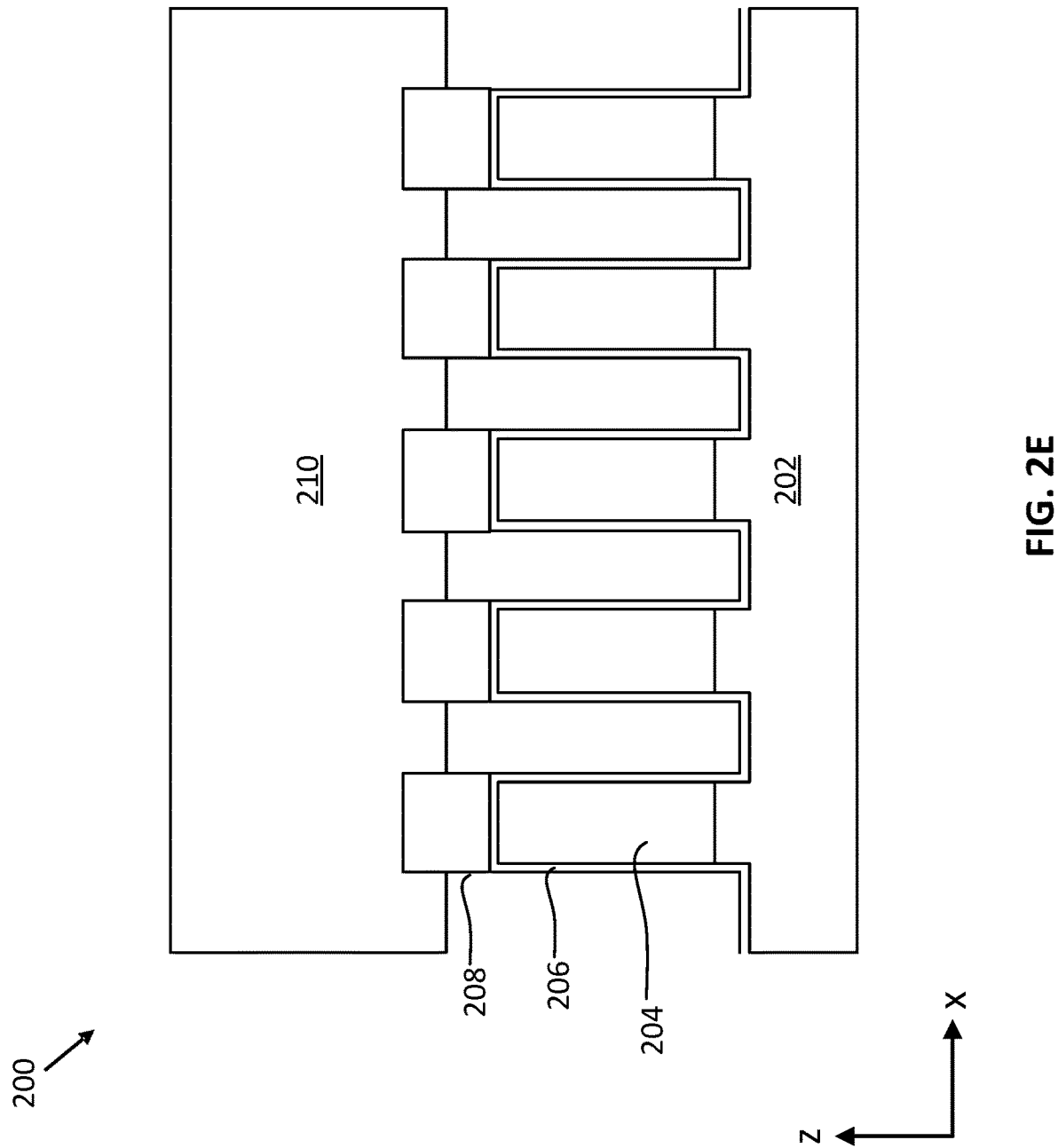

FIG. 2E illustrates a further progression in the fabrication of interconnect structure 200 where a second dielectric layer 210 is deposited on helmet structures 208 and over conductive traces 204, thus sandwiching conductive traces 204 and helmet structures 208 between first dielectric layer 202 and second dielectric layer 210. According to some embodiments, due to the presence of helmet structures 208, a bottom surface of second dielectric layer 210 may be located between a top surface of helmet structures 208 and a bottom surface of helmet structures 208. The bottom surface of second dielectric layer 210 may have any surface shape, such as flat, curved, triangular, etc. In still other embodiments, due to the presence of helmet structures 208, a bottom surface of second dielectric layer 210 may be co-planar with a top surface of helmet structures 208. According to some such embodiments, no (or at most a minimal or otherwise negligible) portion of second dielectric layer 210 deposits into the airgap between adjacent ones of conductive traces 204. A negligible portion or amount as used herein would be an amount of dielectric material that does not cause the maximum height of the airgap to drop below the maximum height of the conductive traces 204. Thus, a space exists at least along an entire height of conductive traces 204 between adjacent ones of conductive traces 204 that is devoid of first dielectric material 202. In some embodiments, a space exists along the entire height of conductive traces 204, such that neither material of first dielectric layer 202 nor material of second dielectric layer 210 causes the uppermost surface of the airgap to drop below the uppermost surface of the conductive traces 204, or causes the bottommost surface of the airgap to rise above the bottommost surface of the conductive traces 204.

Second dielectric layer 210 may be any suitable ILD material and may be deposited using PVD, CVD, or other suitable deposition techniques to avoid depositing second dielectric layer 210 within the spaces between adjacent ones of conductive traces 204. In some embodiments, second dielectric layer 210 is the same material as first dielectric layer 202. In some embodiments, second dielectric layer 210 is the same material as helmet structures 208. By keeping the spaces between adjacent ones of conductive traces 204 free of material, the parasitic capacitance between adjacent ones of conductive traces 204 is minimized since air (or other gas, or a vacuum) has a relatively low dielectric constant.

The helmet structures have many other useful applications beyond acting as a height buffer. For example, multiple helmet structures can be sequentially deposited to form high-aspect ratio structures. The ability to form high-aspect ratio structures on-demand is useful for ultimately forming high-aspect ratio interconnect traces that have low resistance while maintaining a high packing density. FIGS. 3 and 4 illustrate two example fabrication procedures that utilize helmet structures to form high-aspect ratio conductive traces.

Figure 3A:
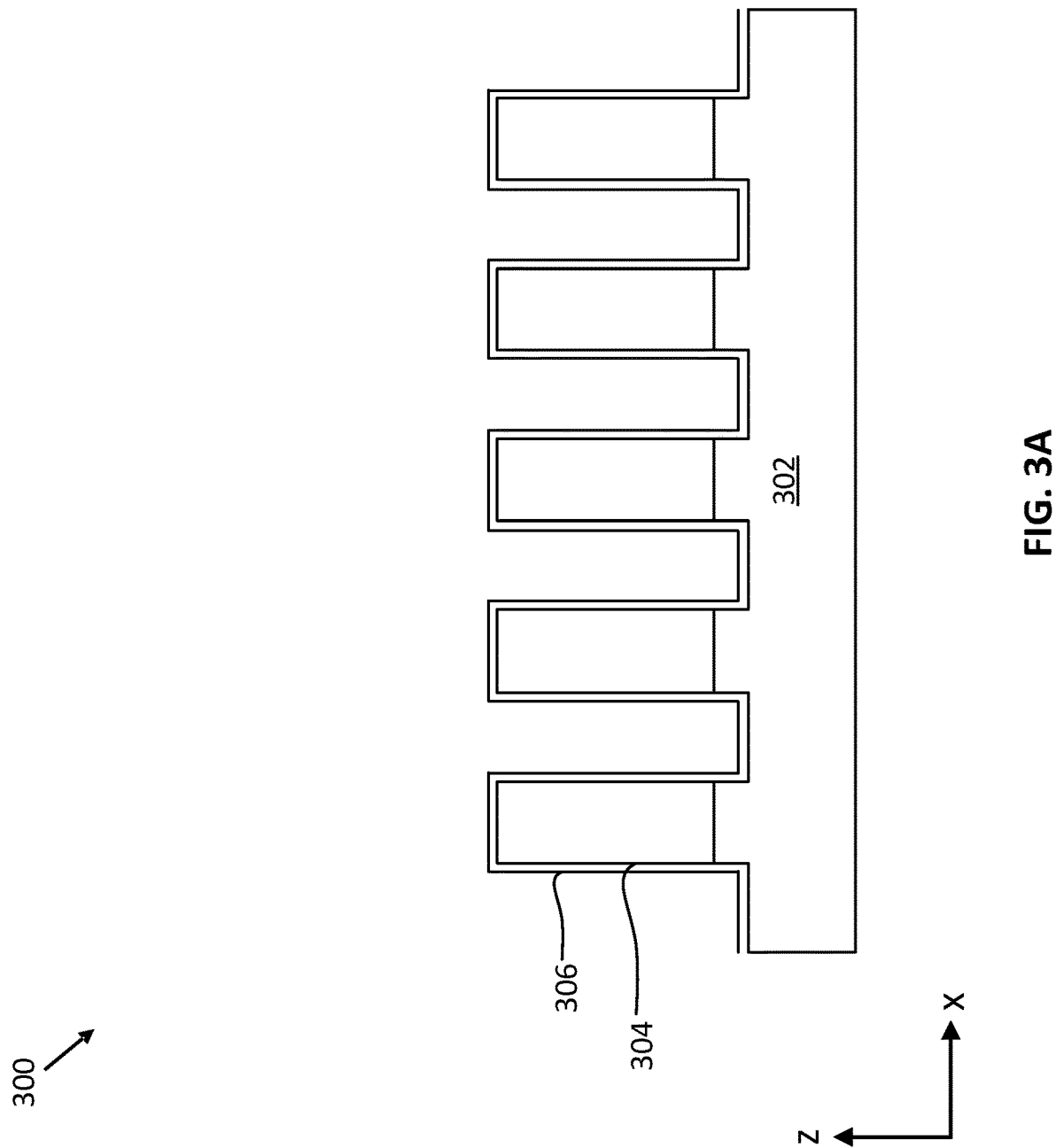

FIG. 3A illustrates a plurality of conductive traces 304 formed over a first dielectric layer 302 and arranged in a lateral sequence as part of an interconnect structure 300, according to an embodiment. Conductive traces 304 may include layer 306 over its surfaces. Each of the components illustrated in FIG. 3A may have the same material, same dimensions, and may have been formed using the same techniques, as described above for FIGS. 2A-2C, and that relevant discussion is equally applicable here.

Figure 3B:
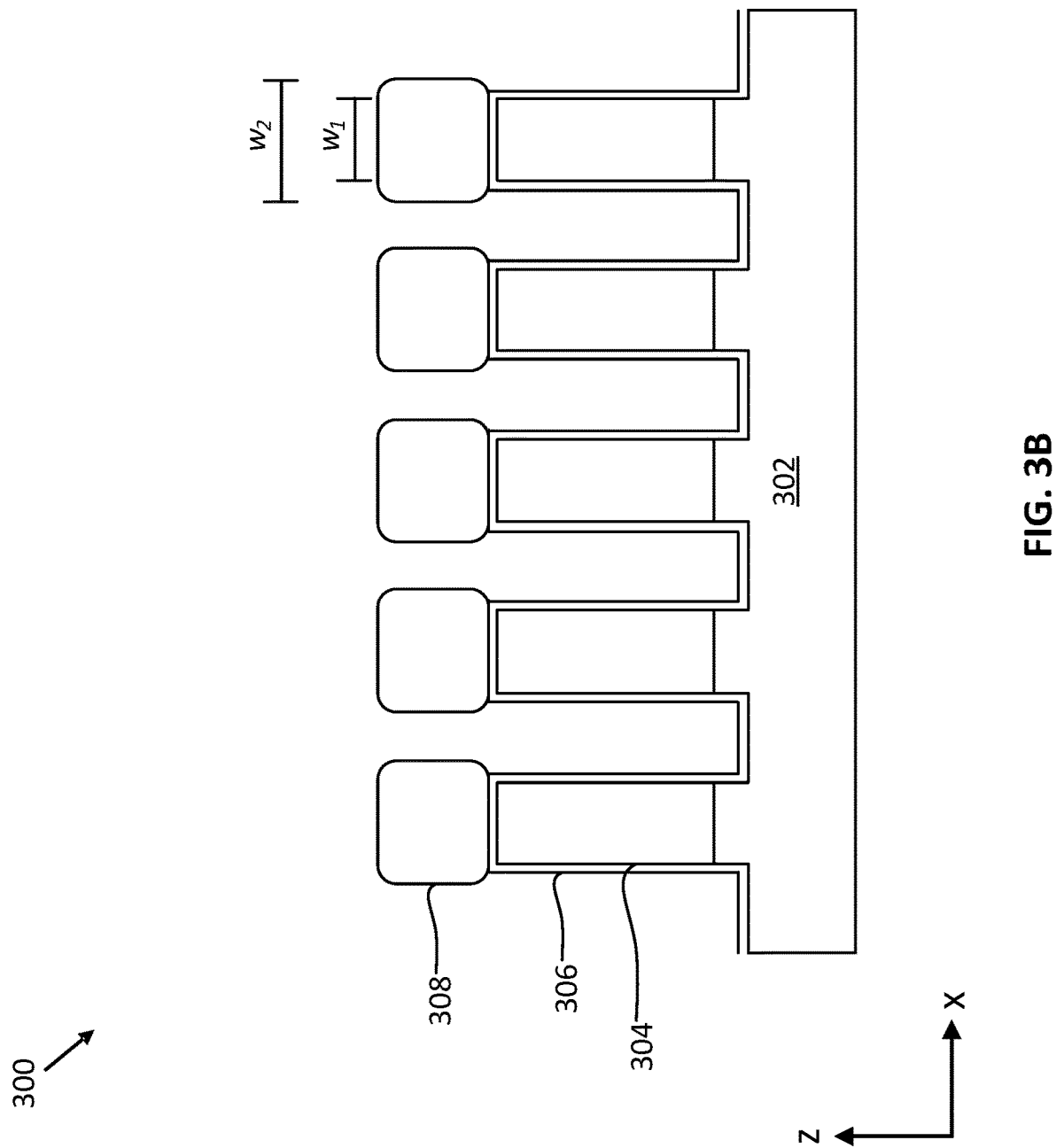

FIG. 3B illustrates a further progression in the fabrication of interconnect structure 300 where helmet structures 308 are deposited over top surfaces of conductive traces 304. According to some embodiments, helmet structures 308 include a dielectric material and are deposited using a PVD process. In some examples, helmet structures 308 include amorphous silicon, titanium nitride, or a low-k material such as porous silicon oxide, although other materials can be used that can be selectively deposited on the tops of conductive traces 304, as will be appreciated. In some other examples, helmet structures 308 are amorphous silicon. The PVD or other selective deposition technique is used to maximize the deposition of helmet structures 308 over the top surfaces of conductive traces 304, while minimizing deposition between conductive traces 304. A width $w_2$ of helmet structures 308 may be greater than a width $w_1$ of conductive traces 304 due to the deposition process. Various deposition process parameters (such as deposition time, temperature, pressure, RF power, reactant species is available at top surfaces of conductive traces 304 only, and other such selective deposition factors) may be tuned to affect width $w_2$, however, $w_2$ will typically be greater than $w_1$. In some examples, helmet structures 308 have a thickness between about 5 nm and about 50 nm. Helmet structures 308 are illustrated as blocks with rounded corners, however other shapes including cone-like or tapered shapes may result, depending on the deposition process.

Figure 3C:
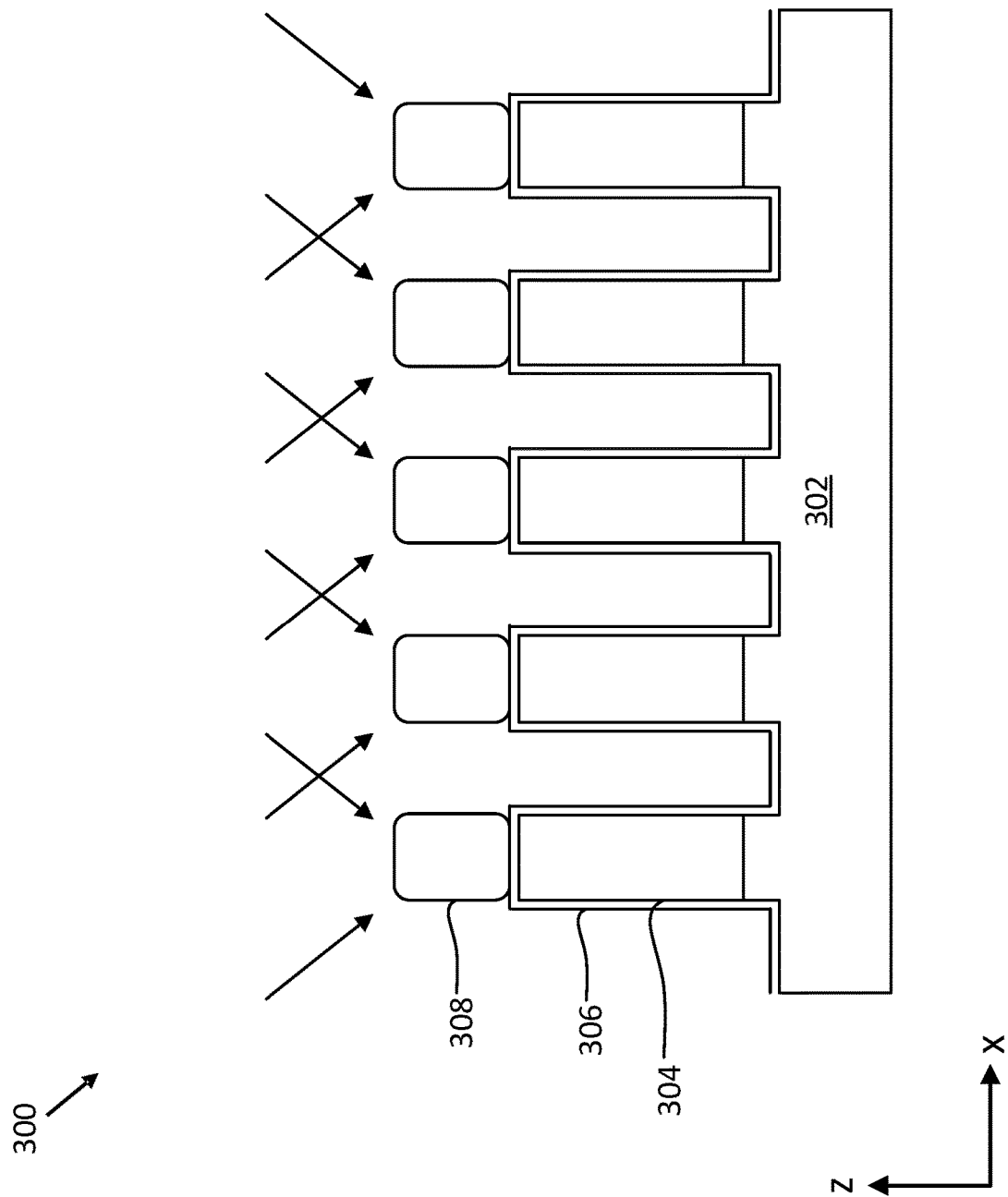

FIG. 3C illustrates a further progression in the fabrication of interconnect structure 300 where the width of helmet structures 308 is reduced using an angled etching process, according to an embodiment. The width of helmet structures 308 may be reduced to be substantially the same width (e.g., within less than 5 nm) as conductive traces 304, according to some such embodiments. Any reactive ion tool may be used to provide the angled etch, with the etch angle being anywhere between 5 degrees and 30 degrees. In some embodiments, the angled etching may be performed only along one side (e.g., trimming back only one side of helmet structure 308). In some embodiments, the angled etch is applied in two directions so as to reduce the of the helmet structures 308 by trimming opposing sides of the helmet structures 308. In other embodiments, the angled etch rotates about the z-axis such that all sides of helmet structure 308 are affected by the angled etch. Any amount of etching may be performed to "sculpt" the final size of helmet structures 308.

Figure 3D:
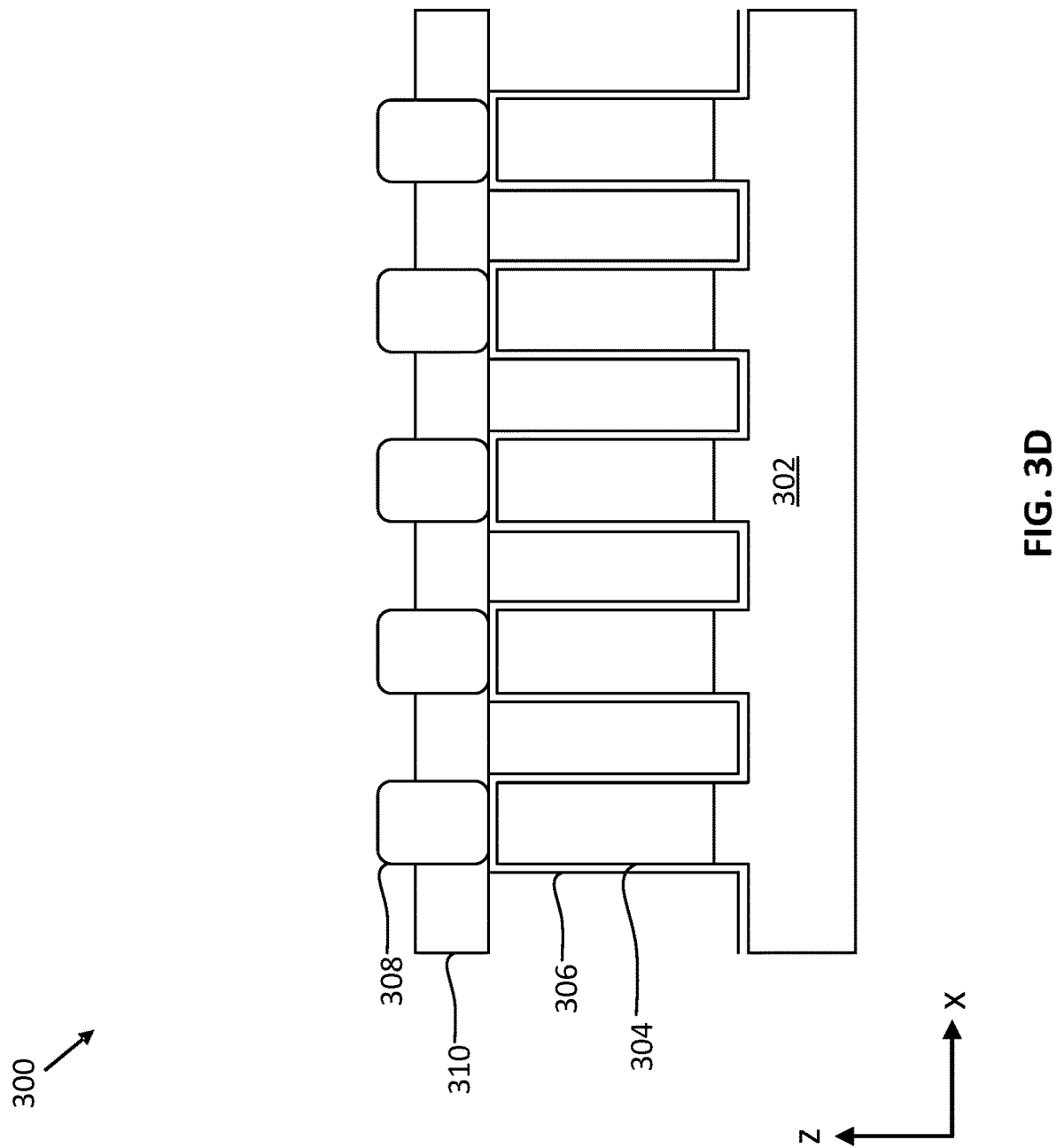

FIG. 3D illustrates a further progression in the fabrication of interconnect structure 300 where a second dielectric layer 310 is deposited between helmet structures 308 to seal the airgap cavities between conductive traces 304, according to an embodiment. A deposition process such as the one used to provide dielectric layer 210 may be used to provide second dielectric layer 310, and that previous relevant discussion is equally applicable here. Second dielectric layer 310 may be etched back after being deposited in order to expose the top portion of helmet structures 308, as illustrated. Exposing the top portions of helmet structures 308 allows for further helmet structures to be fabricated over the existing helmet structures 308. In the example embodiment shown, the dielectric layer 310 may be etched back to be lower than the top portion of helmet structures 308. In other example embodiments, the dielectric layer 310 may be etched back to be coplanar with the top portion of helmet structures 308. Second dielectric layer 310 may be any suitable ILD material and may be deposited using PVD or other deposition technique suitable to avoid depositing non-negligible amounts of second dielectric layer 310 within the spaces between adjacent ones of conductive traces 304. In some embodiments, second dielectric layer 310 is the same material as first dielectric layer 302. In some embodiments, second dielectric layer 310 is a different material than helmet structures 308. For example, second dielectric layer 310 may be a material with a high etch selectivity compared with the material of helmet structures 308.

Figure 3E:
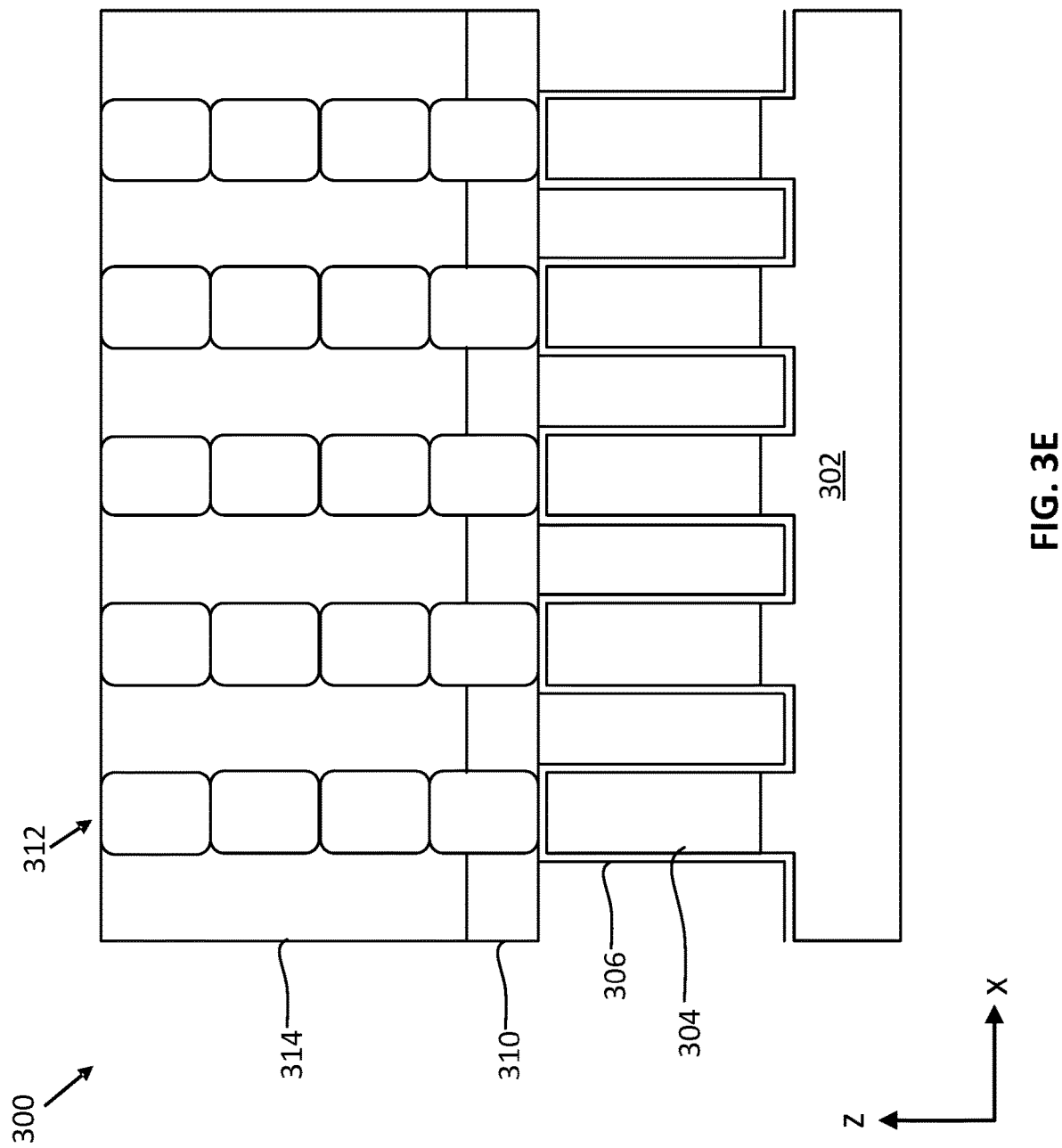

FIG. 3E illustrates a further progression in the fabrication of interconnect structure 300 where repeated helmet structure deposition and etching operations are performed to form a plurality of high-aspect ratio dielectric stacks 312, according to an embodiment. The description above with reference to FIGS. 3B and 3C for depositing and etching helmet structures 308 equally applies for forming each of the helmet structures that make up dielectric stacks 312. Any number of helmet structures may be deposited and sculpted to form dielectric stacks 312 of a desired height. The angled etching process to the helmet structures allows for tall thin structures to be made.

As can be further seen in FIG. 3E, a third dielectric layer 314 is deposited over second dielectric layer 310 and between dielectric stacks 312, according to an embodiment. Third dielectric layer 314 may be the same material as second dielectric layer 310 (third dielectric layer 314 and second dielectric layer 310 may be collectively called dielectric material). Third dielectric layer 314 may be deposited such that it is at least as thick as the height of dielectric stacks 312. A polishing process such as, for example, chemical mechanical polishing (CMP) may be used to planarize the top surface of third dielectric layer 314 and to expose the top surfaces of dielectric stacks 312.

Figure 3F:
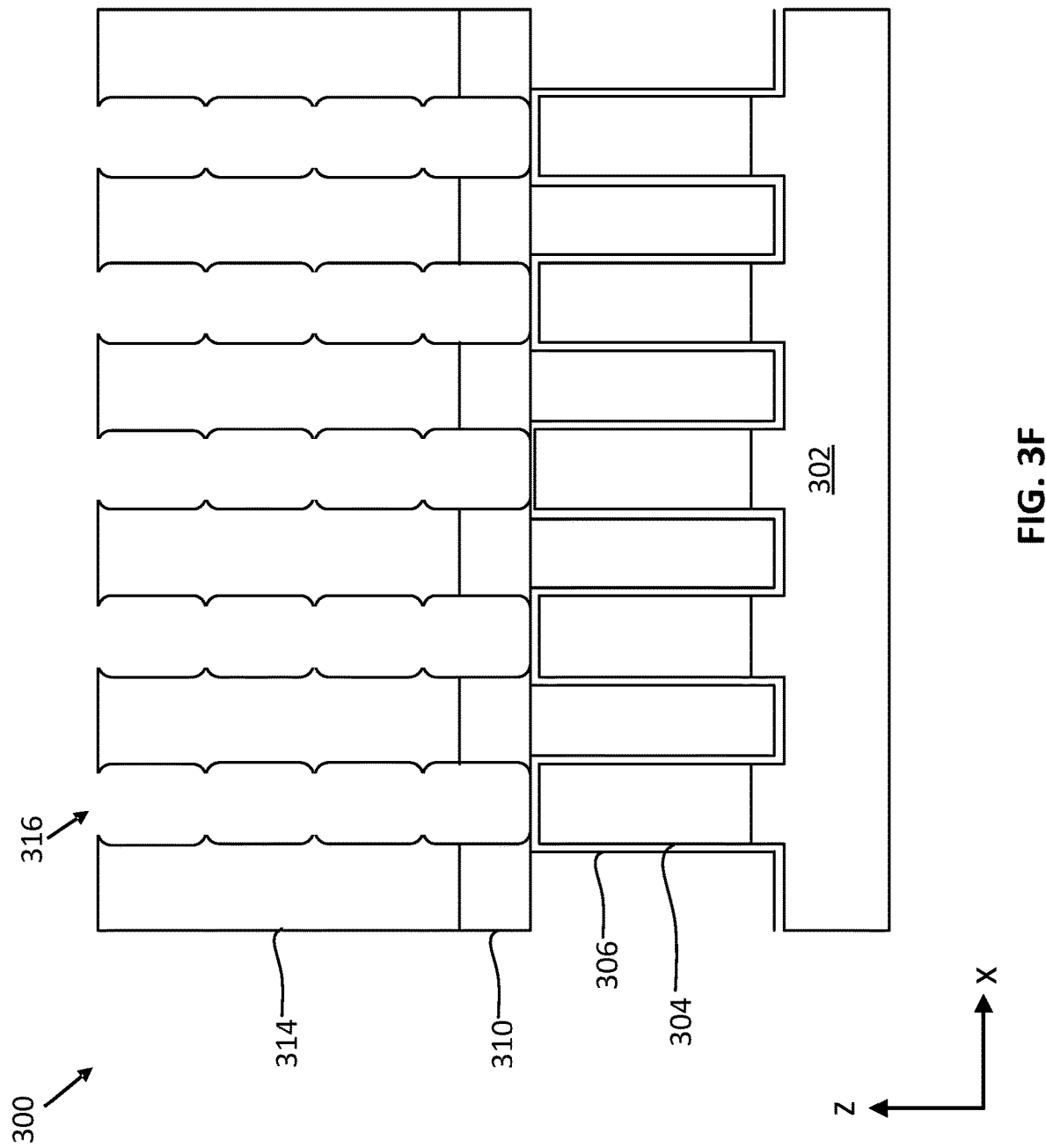

FIG. 3F illustrates a further progression in the fabrication of interconnect structure 300 where dielectric stacks 312 are removed to form openings 316 through a thickness of the surrounding dielectric material (made up of third dielectric layer 314 and second dielectric layer 310), according to an embodiment. Since dielectric stacks 312 were formed over corresponding ones of conductive traces 304, openings 316 expose at least a portion of the top surfaces of conductive traces 304. A wet etching processes may be used to selectively remove dielectric stacks 312 while providing minimal etching to the surrounding dielectric material, in some example embodiments. Dry etching may be performed as well using gas chemistries to selectively remove dielectric stacks 312. In a more general sense, other embodiments may use other etching schemes that are selective to dielectric materials 310 and 314 and thus etch dielectric stacks 312 at a much higher rate than materials 310 and 314. For example, wet etchants that include hydrogen peroxide may be used to selectively remove titanium nitride dielectric stacks 312 from the surrounding silicon oxide dielectric material. Additionally, in some embodiments the layer 306 is also removed along the top surface of conductive traces 304.

FIG. 3G illustrates a further progression in the fabrication of interconnect structure 300 where openings 316 are filled with a conductive material 318, according to an embodiment. Conductive material 318 along with conductive traces 304 together form high-aspect ratio conductive lines 320. Conductive material 318 may be a metal or metal alloy. Some examples of conductive materials to use for conductive material 318 include titanium nitride (TiN), titanium silicon nitride (TiSiN), tantalum nitride (TaN), titanium aluminum carbon nitride (TiAlCN), polysilicon (pSi), copper (Cu), aluminum (Al), gold (Au), tungsten (W), cobalt (Co), platinum (Pt), ruthenium (Ru), and iridium (Ir). In some embodiments, conductive material 318 is the same material as conductive traces 304.

Conductive material 318 may be deposited within openings 316 using any number of suitable deposition techniques, such as CVD, PVD, ALD, or electroplating. In one such example embodiment, a thin seed layer of conductive material may first be deposited followed by the plating of additional conductive material to fill openings 316. Due to the different fabrication processes used, a height of conductive lines 320 may have a first section 322 and a second section 324 over first section 322. First section 322 includes the initial conductive traces 304 that are formed on first dielectric layer 302, and that include airgaps between adjacent ones of conductive traces 304. Further note how the first sections 322 of the conductive lines 320 are configured with linear sidewalls, in that there a no dimples or protuberances along the middle span or length of the first sections. Second section 324 includes conductive material 318 having a rough sidewall topography due to the fabrication process. In particular, note how the second sections 324 have non-linear sidewalls that laterally extend inward at locations along the length of the second section. These lateral inward extensions are referred to herein as dimples. In one such example, the sidewalls of conductive material 318 have a dimpled or scalloped profile due to the mold shape created by dielectric stacks 312, as will be appreciated. Additionally, second section 324 of conductive lines 320 includes surrounding dielectric material from third dielectric layer 314 and second dielectric layer 310 that is not present around first section 322 of conductive lines 320, thereby leaving airgaps between those first sections 322. In some such example embodiments, second section 324 is taller than first section 322. Second section 324 may have a height between about 40 nm and about 400 nm. In other embodiments, second section 324 has about the same height as first section 322. In a more general sense, the height of first section 322 and second section 324 can vary from one embodiment to the next, and the present disclosure is not intended to be limited to any particular height ranges.

Figure 4A:
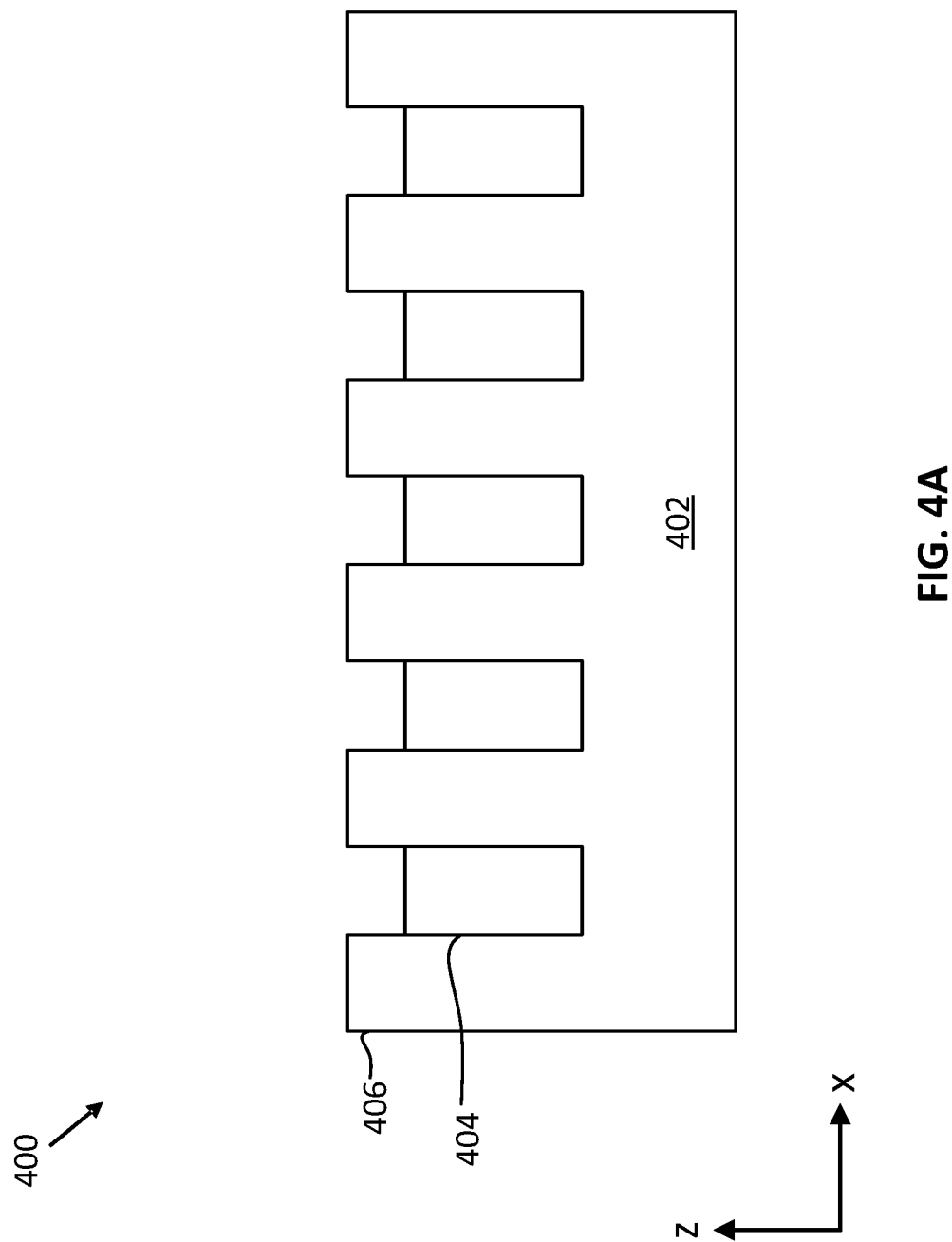
FIGS. 4A-4H illustrate cross-section views of different stages in a fabrication process for an integrated circuit structure that includes another example interconnect structure configured with high aspect ratio conductive features, in accordance with some embodiments of the present disclosure.

With further reference to FIG. 3G, note how the third dielectric layer 314 has a sidewall profile that is complementary to the sidewall profile of the second section 324 of the conductive lines 320. In particular, dielectric material of the third dielectric layer 314 extends into the dimples of the sidewall profile of the second section 324 of the conductive lines 320. These lateral outward extensions are referred to herein as protuberances. Another way to state this complementary interface is by referring to the convex-like sidewall profile of the second section 324 of the conductive lines 320, and the concave-like sidewall profile of the third dielectric layer 314. The linear nature of the first sections 322 of the conductive lines 320 and the non-linear nature of the second sections 324 of the conductive lines 320 is a structural indication that a vertical dielectric helmet stack forming methodology as variously provided herein was used to form interconnect structure 300. FIG. 4A illustrates a plurality of conductive traces 404 formed in a first dielectric layer 402 as part of an interconnect structure 400, according to an embodiment. Conductive traces 404 may have the same characteristics as either conductive traces 304 from FIG. 3 or conductive traces 204 from FIG. 2. However, in interconnect structure 400, the top surfaces of conductive traces 404 are recessed below a top surface of first dielectric layer 402. Conductive traces 404 may be etched back using, for example, a wet and/or dry etching process to form dielectric ridges 406 between adjacent ones of conductive traces 404. Dielectric ridges 406 may have a height between 5 nm and 50 nm, although any height may be used depending on the application. First dielectric layer 402 may have the same characteristics as first dielectric layer 302 from FIG. 3 or first dielectric layer 202 from FIG. 2.

Figure 4B:
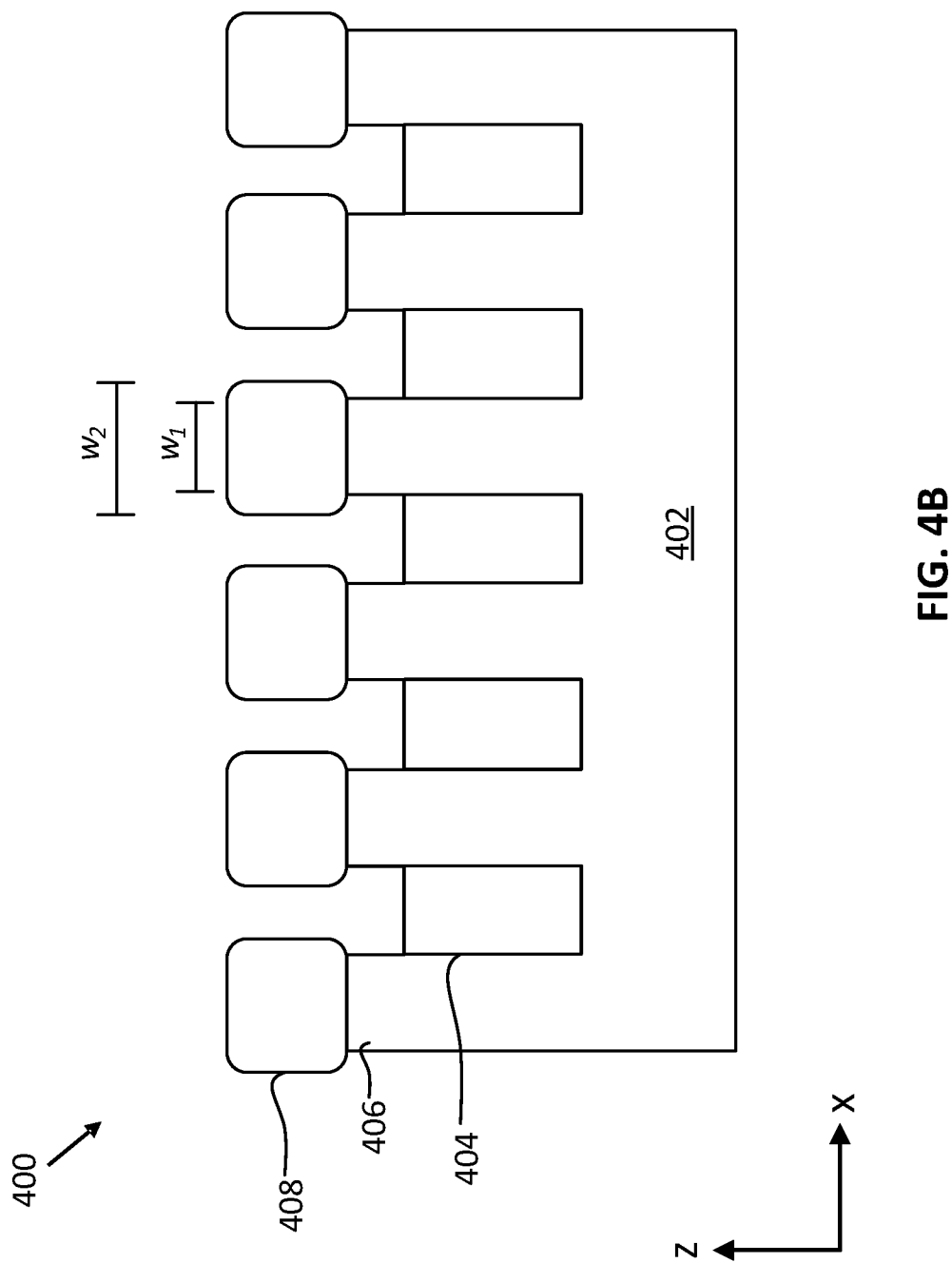

FIG. 4B illustrates a further progression in the fabrication of interconnect structure 400 where helmet structures 408 are selectively deposited over top surfaces of dielectric ridges 406. According to some embodiments, helmet structures 408 include a dielectric material and are deposited using a PVD process, although other suitable deposition techniques can be used that can selectively deposit on the tops of dielectric ridges 406, such as CVD where reactant species is available at the top surface of dielectric ridges 406 where growth is desired. In some examples, helmet structures 408 include amorphous silicon, titanium nitride, or a low-k material such as porous silicon oxide, although other materials can be used that can be selectively deposited on the tops of dielectric ridges 406, as will be appreciated. Helmet structures 408 may have a material that is different from the material of first dielectric layer 402. The PVD or other selective deposition technique is used to maximize the deposition of helmet structures 408 over the top surfaces of dielectric ridges 406, while minimizing deposition between dielectric ridges 406 on conductive traces 404. A width $w_2$ of helmet structures 408 may be greater than a width $w_1$ of dielectric ridges 406 due to the deposition process. Various deposition process parameters (such as deposition time, temperature, pressure, RF power, reactant species available at top surfaces of dielectric ridges 406 only, and other such selective deposition factors) may be tuned to affect width $w_2$, however, $w_2$ will typically be greater than $w_1$. In some examples, helmet structures 408 have a thickness between about 5 nm and about 50 nm. Helmet structures 408 are illustrated as blocks with rounded corners, however other shapes including cone-like or tapered shapes may result, depending on the deposition process.

Figure 4C:
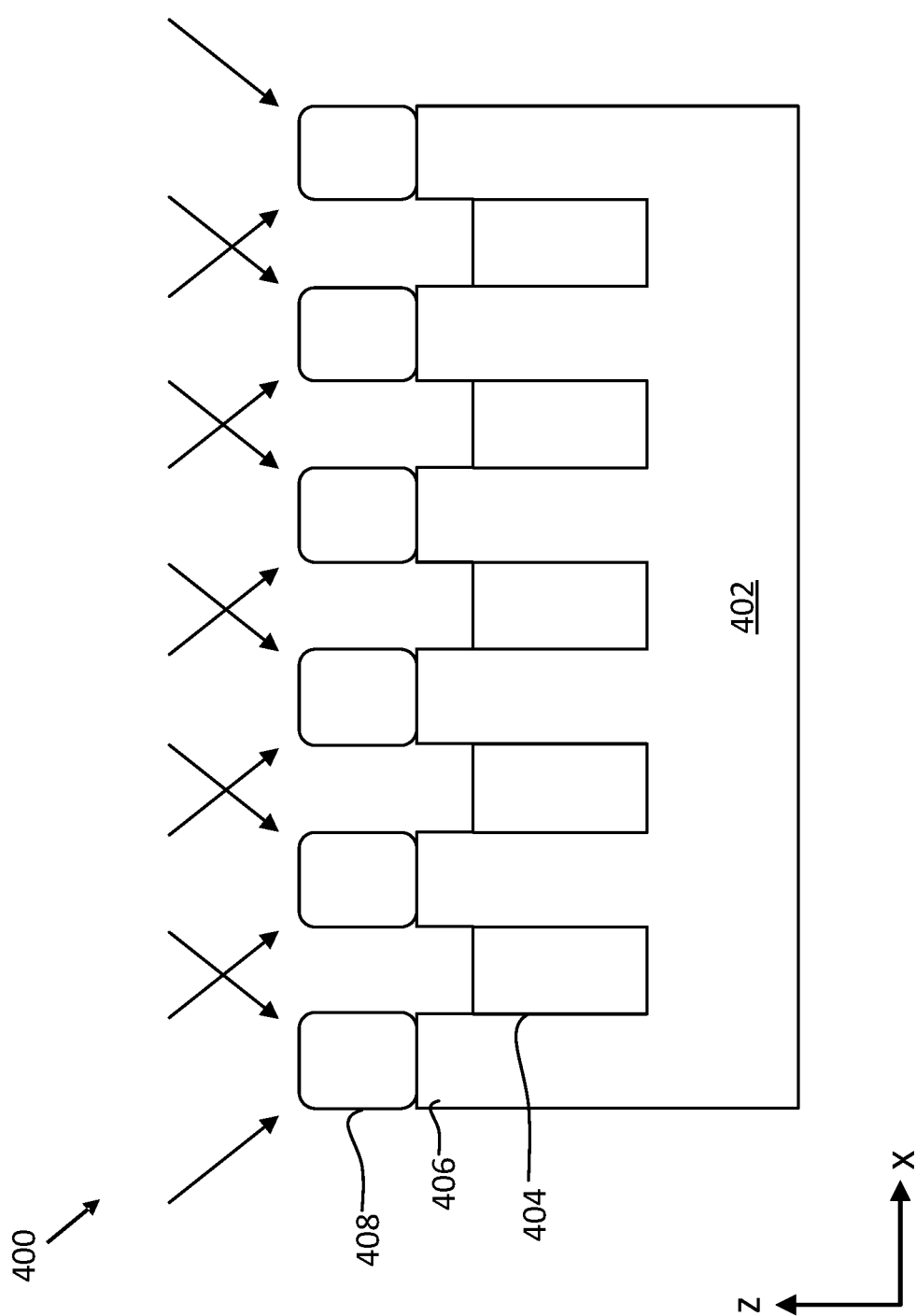

FIG. 4C illustrates a further progression in the fabrication of interconnect structure 400 where the width of helmet structures 408 is reduced using an angled etching processes, according to an embodiment. The width of helmet structures 408 may be reduced to be substantially the same width (e.g., within less than 5 nm) as dielectric ridges 406, according to some such embodiments. Any reactive ion tool may be used to provide the angled etch, with the etch angle being anywhere between 5 degrees and 30 degrees. In some such example embodiments, the angled etching may be performed only along one side (e.g., trimming back only one side of helmet structure 408). In some embodiments, the angled etch is applied in two directions so as to reduce the of the helmet structures 408 by trimming opposing sides of the helmet structures 408. In other embodiments, the angled etch rotates about the z-axis such that all sides of helmet structure 408 are affected by the angled etch. Any amount of etching may be performed to "sculpt" the final size of helmet structures 408.

Figure 4D:
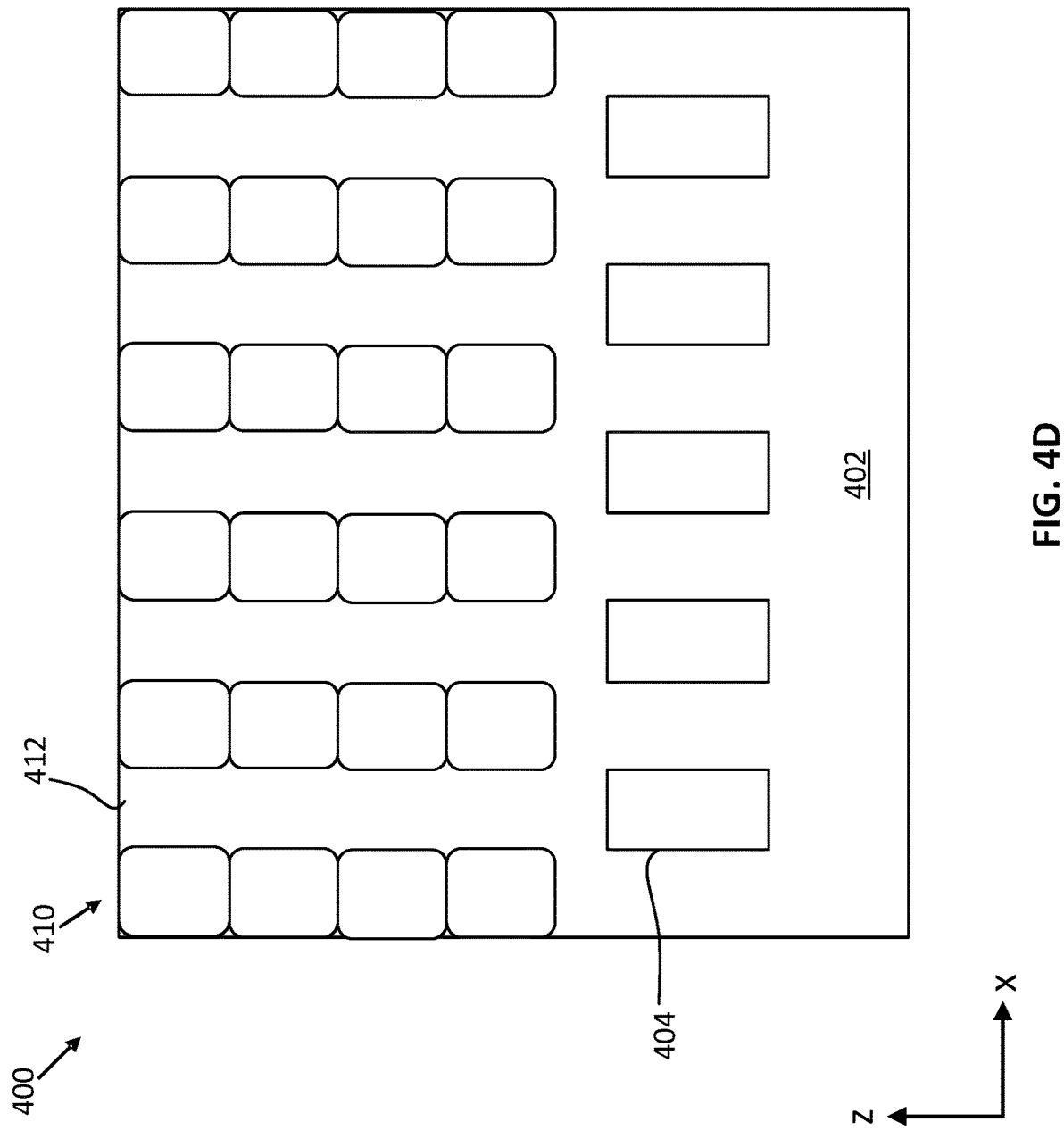

FIG. 4D illustrates a further progression in the fabrication of interconnect structure 400 where repeated helmet structure deposition and etching operations are performed to form a plurality of high-aspect ratio dielectric stacks 410, according to an embodiment. The description above with reference to FIGS. 4B and 4C for depositing and etching helmet structures 408 equally applies for forming each of the helmet structures that make up dielectric stacks 410. Any number of helmet structures may be deposited and sculpted to form dielectric stacks 410 of a desired height. The angled etching process to the helmet structures allows for tall thin structures to be made.

As can be further seen in FIG. 4D, a second dielectric layer 412 is deposited over first dielectric layer 402 and between dielectric stacks 410, according to an embodiment. Accordingly, second dielectric layer 412 is also deposited on the top surfaces of conductive traces 404. Second dielectric layer 412 may be the same material as first dielectric layer 402. Second dielectric layer 412 may be deposited such that it is at least as thick as the height of dielectric stacks 410. A polishing process such as, for example, CMP may be used to planarize the top surface of second dielectric layer 412 and to expose the top surfaces of dielectric stacks 410.

Figure 4E:
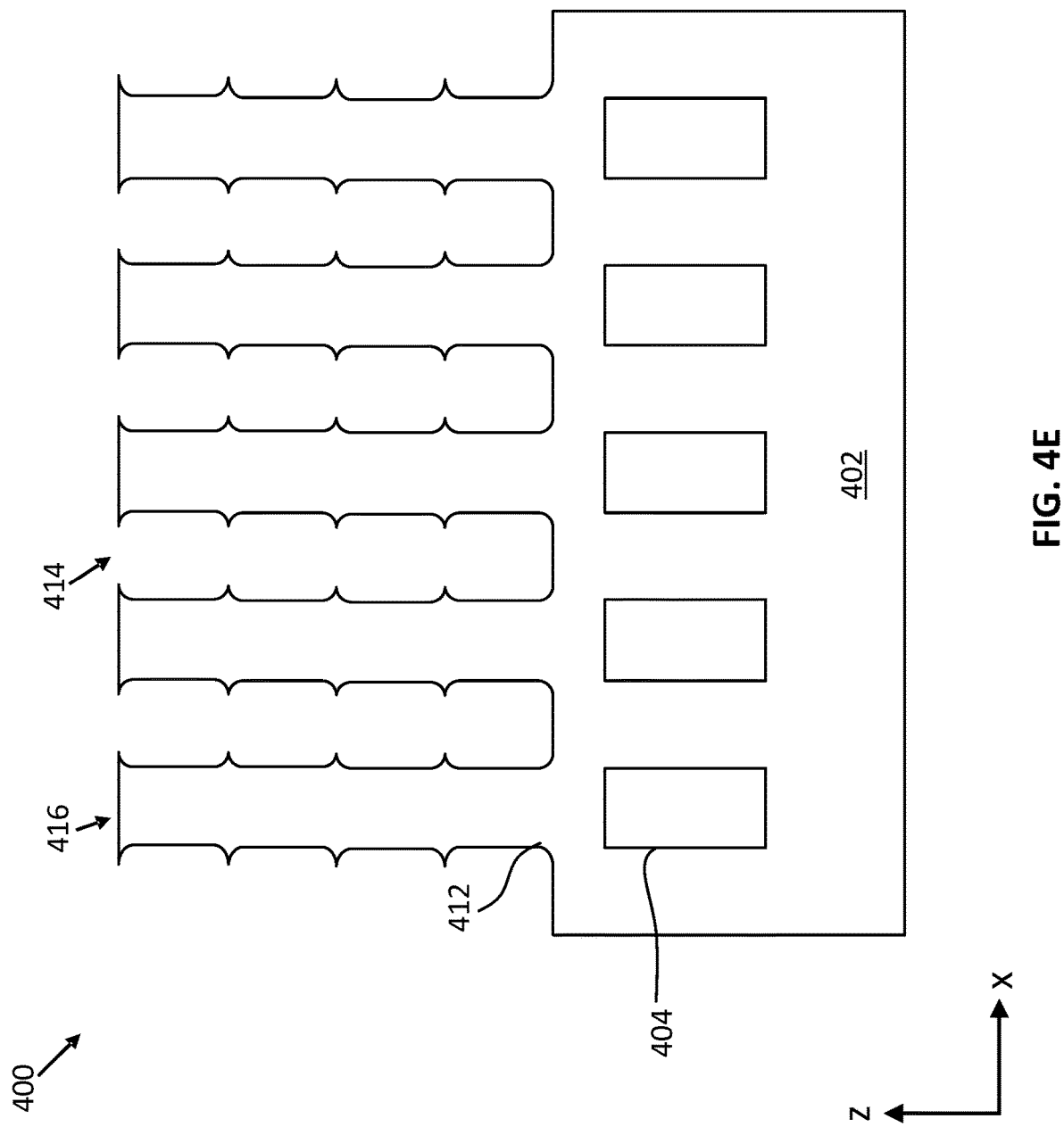

FIG. 4E illustrates a further progression in the fabrication of interconnect structure 400 where dielectric stacks 410 are removed to form openings 414 through a thickness of the surrounding second dielectric layer 412, according to an embodiment. Since dielectric stacks 410 were formed in spaces between conductive traces 404, openings 414 create large dielectric ridges 416 over conductive traces 404. Large dielectric ridges 416 may be substantially aligned with conductive traces 404. A wet etching process may be used to selectively remove dielectric stacks 410 while providing minimal etching to the surrounding second dielectric layer 412. Dry etching may be performed as well using gas chemistries to selectively remove dielectric stacks 410. In a more general sense, other embodiments may use other etching schemes that are selective to dielectric materials 406 and 412 and thus etch dielectric stacks 410 at a much higher rate than materials 406 and 412. For example, wet etchants that include hydrogen peroxide may be used to selectively remove titanium nitride dielectric stacks 410 from the surrounding silicon oxide dielectric material.

Figure 4F:
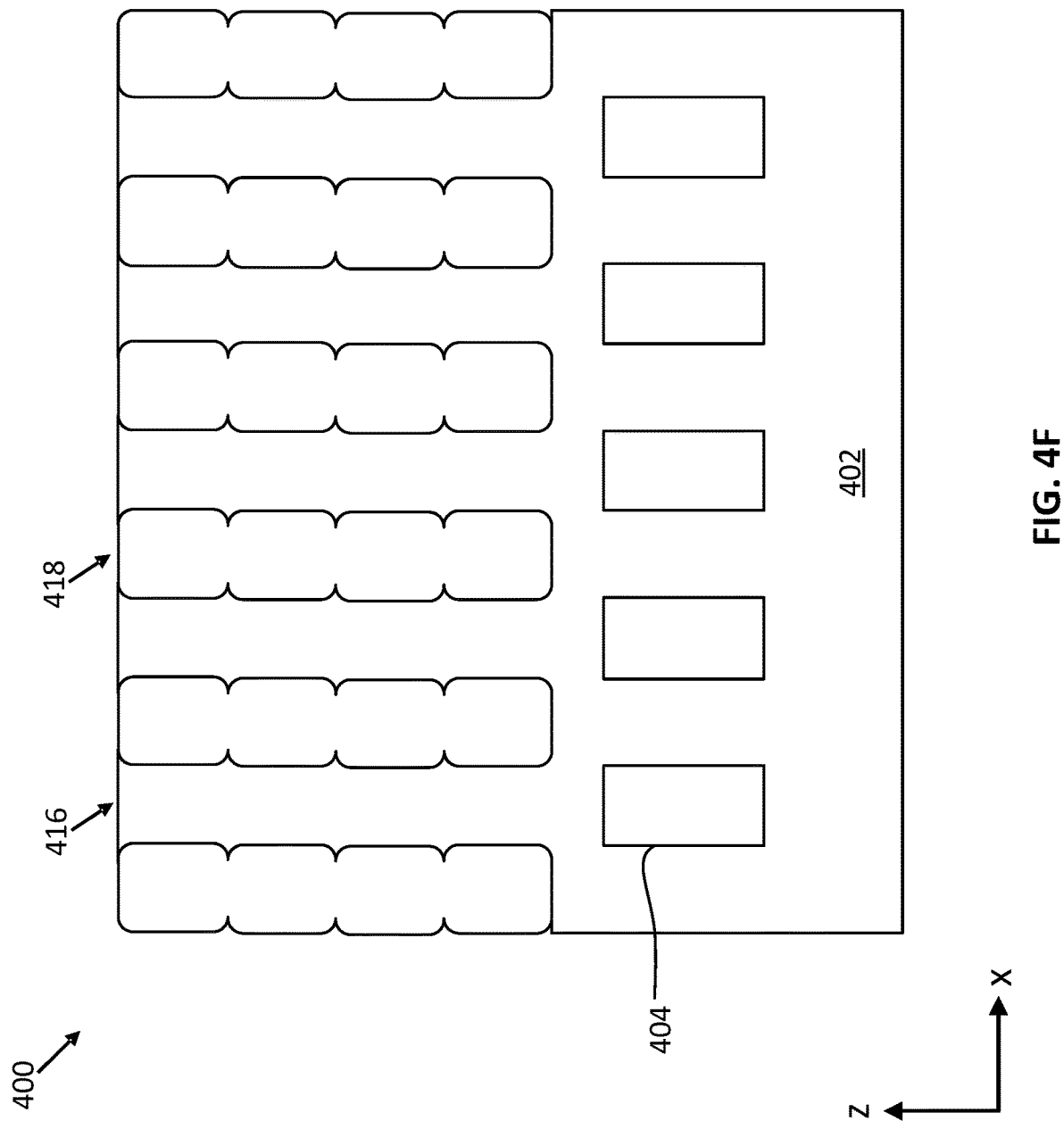

FIG. 4F illustrates a further progression in the fabrication of interconnect structure 400 where openings 414 are filled with dielectric material 418, according to an embodiment. Dielectric material 418 may be any non-conductive material that has high etch selectivity with the surrounding second dielectric layer 412. For example, dielectric material 418 may be silicon nitride while second dielectric layer 412 may be silicon oxide. Dielectric material 418 may be deposited using, for example, CVD or PVD or ALD techniques to ensure complete coverage within openings 414.

Figure 4G:
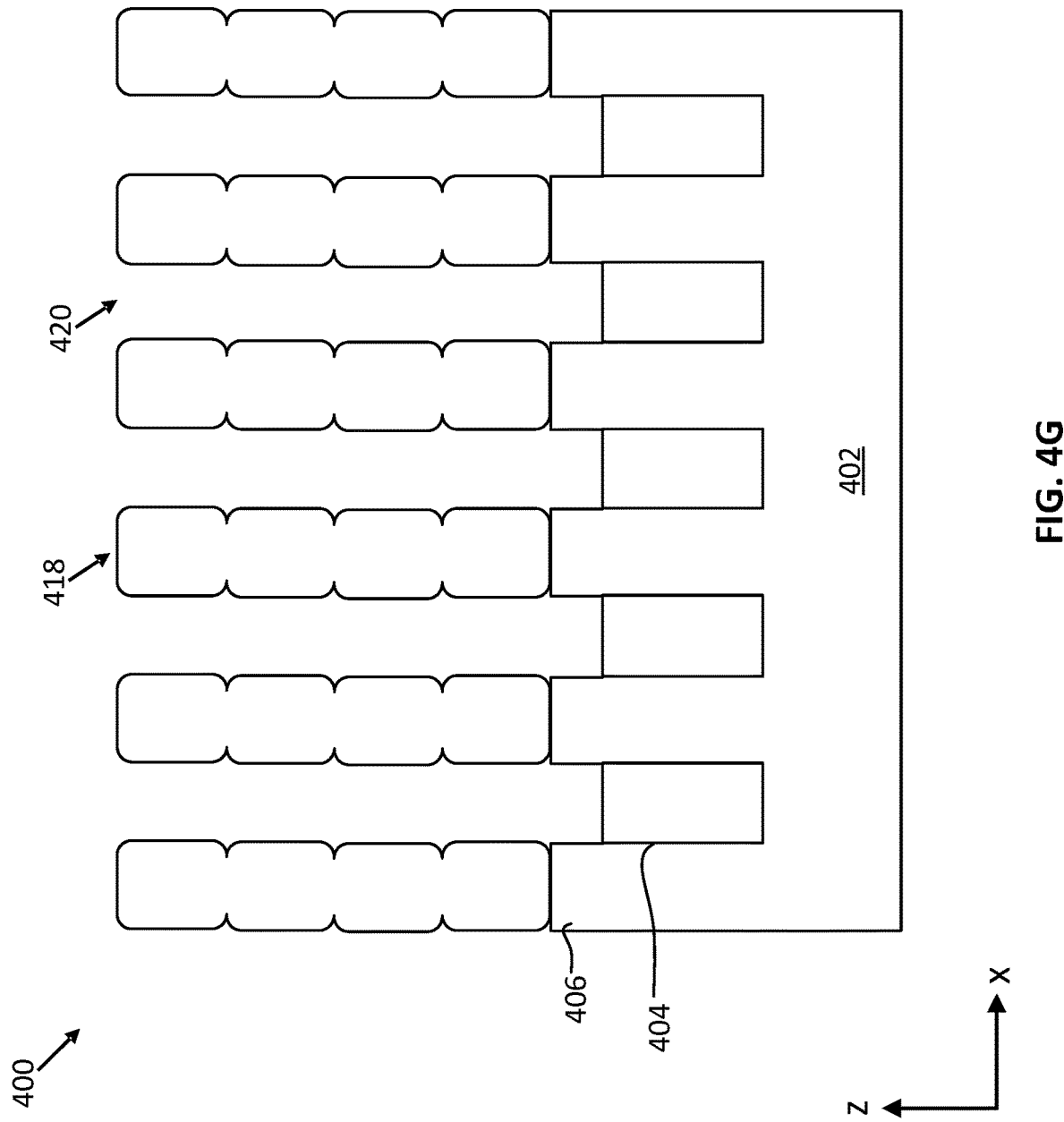

FIG. 4G illustrates a further progression in the fabrication of interconnect structure 400 where large dielectric ridges 416 are removed between dielectric material 418 to form openings 420, according to an embodiment. Since large dielectric ridges 416 were formed over corresponding conductive traces 404, openings 420 expose at least a portion of the top surfaces of conductive traces 404. In one example embodiment, a wet etching process may be used to selectively remove large dielectric ridges 416 while providing minimal etching to the surrounding dielectric material 418. Dry etching may be performed as well using gas chemistries to selectively remove large dielectric ridges 416. Note that the removal of the bottom portion of large dielectric ridges 416 may also laterally etch the underlying dielectric ridges 406 of first dielectric layer 402. This lateral etch may cause some undercutting of the dielectric ridges 406 beneath dielectric material 418. Thus, the dielectric ridges 406 beneath dielectric material 418 may have a cross-sectional profile that reveals, for instance, a horizontal width that is narrower than the horizontal width of the dielectric material 418 above that the dielectric ridges 406. Likewise, the cross-sectional profile may further reveal concave sidewalls of the dielectric ridges 406, as will be appreciated.

Figure 4H:
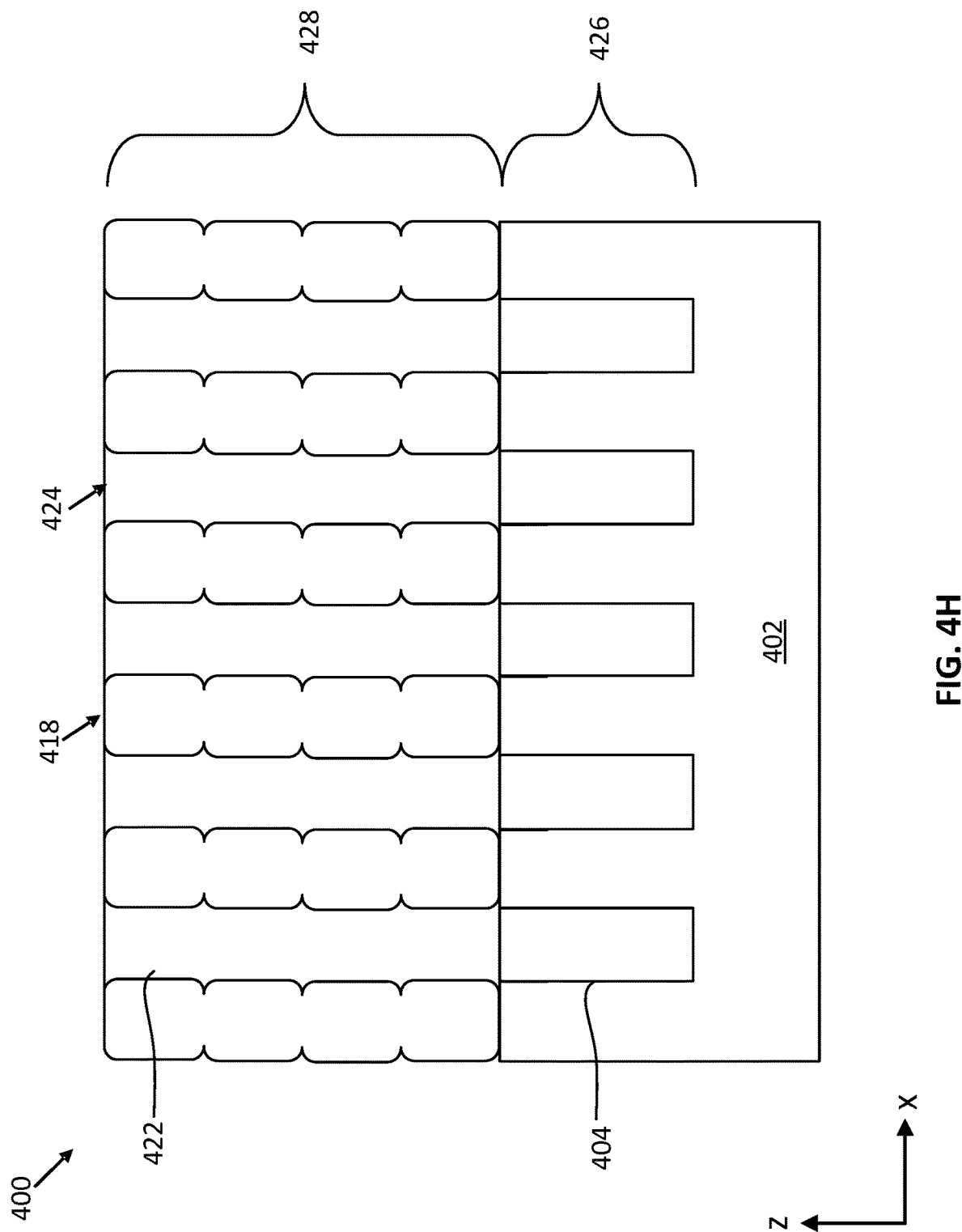

FIG. 4H illustrates a further progression in the fabrication of interconnect structure 400 where openings 420 are filled with a conductive material 422, according to an embodiment. Conductive material 422 along with conductive traces 404 together form high-aspect ratio conductive lines 424. Conductive material 422 may be a metal or metal alloy. Some examples of conductive materials to use for conducive material 422 include titanium nitride (TiN), titanium silicon nitride (TiSiN), tantalum nitride (TaN), titanium aluminum carbon nitride (TiAlCN), polysilicon (pSi), copper (Cu), aluminum (Al), gold (Au), tungsten (W), cobalt (Co), platinum (Pt), ruthenium (Ru), and iridium (Ir). In some embodiments, conductive material 422 is the same material as conductive traces 404.

Conductive material 422 may be deposited within openings 420 using any number of suitable deposition techniques, such as CVD, PVD, ALD, or electroplating. In one such example embodiment, a thin seed layer of conductive material may first be deposited followed by the plating of additional conductive material to fill openings 420. Due to the different fabrication processes used, a height of conductive lines 424 may have a first section 426 and a second section 428 over first section 426. First section 426 includes the initial conductive traces 404 that are formed in first dielectric layer 402. First dielectric layer 402 fills the space between adjacent ones of conductive traces 404 in first section 426 of conductive lines 424. Further note how the first sections 426 of the conductive traces 404 are configured with linear sidewalls, in that there a no dimples or protuberances along the middle span or length of the first sections. Second section 428 includes conductive material 422 having a rough sidewall topography due to the fabrication process. In particular, note how the second sections 428 have non-linear sidewalls that laterally extend outward at locations along the length of the second section. These lateral outward extensions are referred to herein as protuberances. In one such example embodiment, the sidewalls of conductive material 422 have a scalloped profile due to the mold shape created by dielectric material 418. Additionally, second section 428 of conductive lines 424 includes surrounding dielectric material (from dielectric material 418) that is not present around first section 426 of conductive lines 424. In some such example embodiments, second section 428 is taller than first section 426. Second section 428 may have a height between about 40 nm and about 400 nm. In other embodiments, second section 428 has about the same height as first section 426. In a more general sense, the height of first section 426 and second section 428 can vary from one embodiment to the next, and the present disclosure is not intended to be limited to any particular height ranges.

With further reference to FIG. 4H, note how the dielectric material 418 has a sidewall profile that is complementary to the sidewall profile of the second section 428 of the conductive lines 424. In particular, sidewalls of dielectric material 418 include dimples into which extends the protuberances of the second section 324 of the conductive lines 320. Another way to state this complementary interface is by referring to the convex-like sidewall profile of the dielectric material 418, and the concave-like sidewall profile of the second section 428 of the conductive lines 424. The linear nature of the first sections 426 of the conductive lines 424 and the non-linear nature of the second sections 428 of the conductive lines 424 is a structural indication that a vertical dielectric helmet stack forming methodology as variously provided herein was used to form interconnect structure 400.

Figure 5:
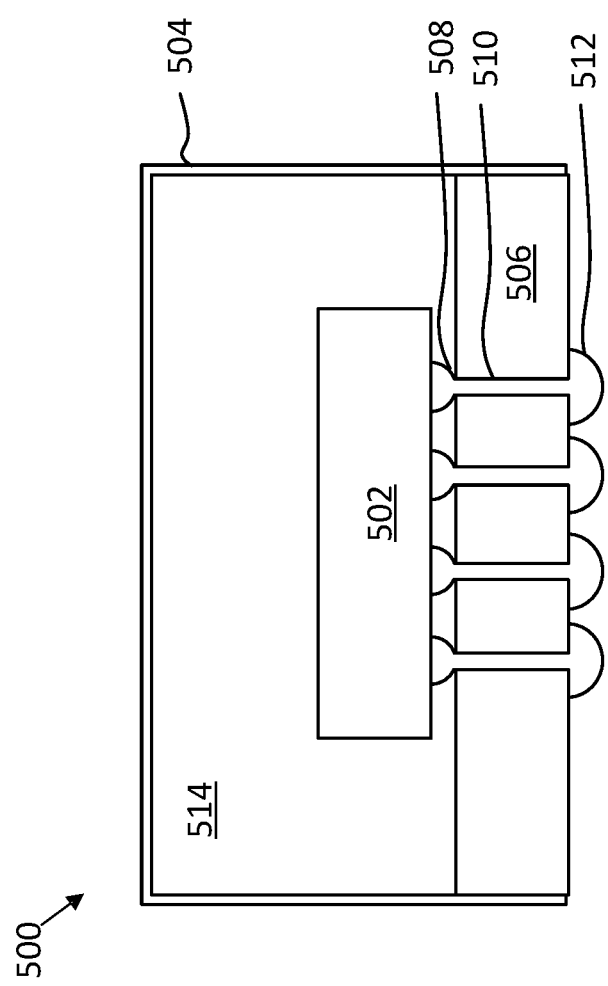
FIG. 5 illustrates a cross-section view of a chip package containing one or more semiconductor dies including one or more interconnect structures, in accordance with some embodiments of the present disclosure.

FIG. 5 illustrates an example embodiment of a chip package 500. As can be seen, chip package 500 includes one or more dies 502. One or more dies 502 may include at least one semiconductor chip having one or more interconnect structures, such as any of interconnect structures 200, 300, or 400. One or more dies 502 may include any other circuitry used to interface with other devices formed on the dies, or other devices connected to chip package 500, in some example configurations.

As can be further seen, chip package 500 includes a housing 504 that is bonded to a package substrate 506. The housing 504 may be any standard or proprietary housing, and provides, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board. One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between dies 502 and package substrate 506 as an underfill material, as well as between dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to be electrically insulating.

Figure 6:
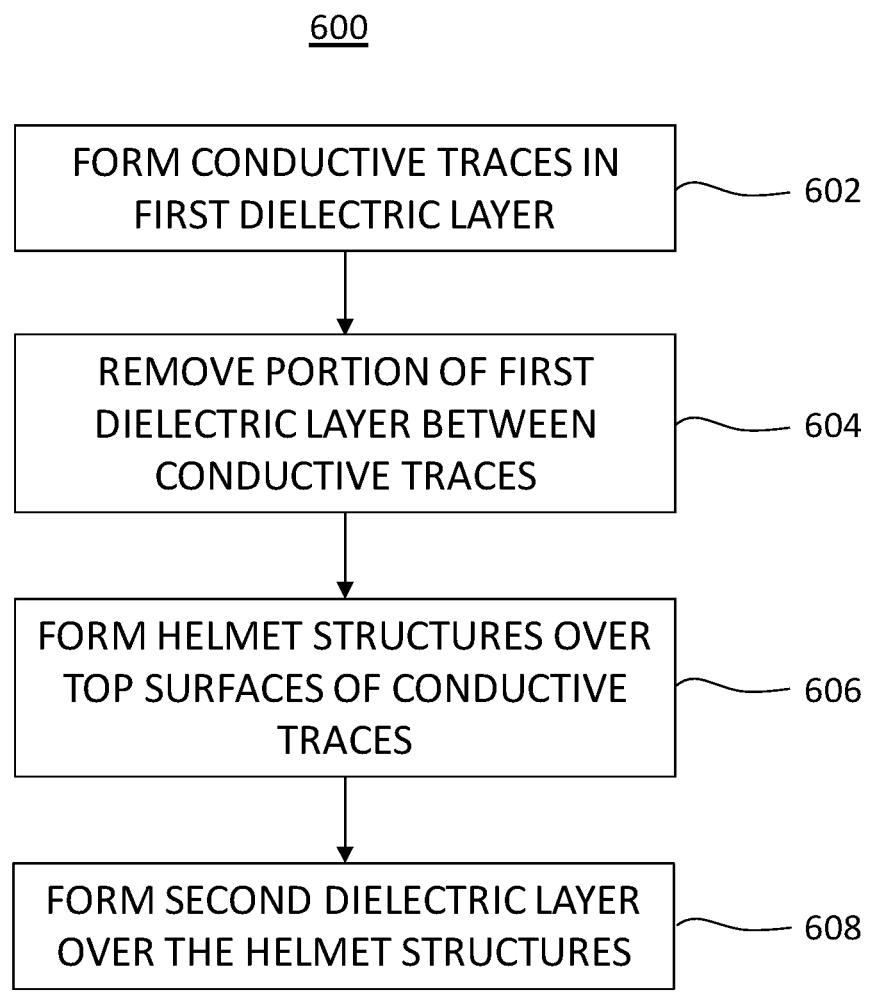
FIG. 6 is a flowchart of a fabrication process for an example interconnect structure configured with elongated airgaps, in accordance with an embodiment of the present disclosure.

FIG. 6 is a flow chart of a method 600 for fabricating an interconnect structure, according to an embodiment. Various operations of method 600 may be illustrated in FIGS. 2A-2E. However, the correlation of the various operations of method 600 to the specific components illustrated in FIGS. 2A-2E is not intended to imply any structural and/or use limitations. Rather, FIGS. 2A-2E provide one example embodiment of method 600. Other operations may be performed before, during, or after any of the operations of method 600.

Method 600 begins at operation 602 where a plurality of conductive traces are formed in a first dielectric layer. The conductive traces may be metal lines in a given level of a multi-level interconnect structure. The conductive traces may be formed using standard lithography processes (such as the damascene process) to fill trenches within the first dielectric layer with a conductive material. The first dielectric layer may be any suitable ILD material. In some embodiments, the first dielectric layer is formed over one or more other dielectric layers on a substrate. In still other embodiments, the first dielectric layer is formed directly on a substrate, or on a local interconnect that is itself directly on the substrate.

Method 600 continues with operation 604 where a portion of the first dielectric layer between the conductive traces is removed. The removal of the first dielectric layer portion exposes the sides of the conductive traces along with the top surfaces of the conductive traces, such that the first dielectric layer is recessed below bottom surfaces of the conductive traces. In some embodiments, the first dielectric layer is etched using a conventional RIE process or using conventional wet chemical etchants.

Method 600 continues with operation 606 where helmet structures are formed over top surfaces of the conductive traces. In some embodiments, the helmet structures are formed directly on the top surfaces of the conductive traces. According to some embodiments, the helmet structures include a dielectric material and are deposited using a selective PVD or CVD process. In some examples, the helmet structures are amorphous silicon or titanium nitride, although other materials will be apparent in light of this disclosure. The selective deposition technique is used to maximize the deposition of the helmet structures over the top surfaces of the conductive traces, while minimizing deposition between the conductive traces. The helmet structures may have a width that is greater than the width of the underlying conductive traces.

Method 600 continues with operation 608 where a second dielectric layer is formed over the helmet structures. In some embodiments, the second dielectric layer is formed directly on the helmet structures. The second dielectric layer may be any suitable ILD material and may be selectively deposited using, for example, PVD or CVD to avoid depositing the second dielectric layer within the spaces between adjacent ones of the conductive traces. According to some embodiments, due to the presence of the helmet structures, a bottom surface of the second dielectric layer may be located between a top surface of the helmet structures and a bottom surface of the helmet structures. In still other embodiments, due to the presence of helmet structures, a bottom surface of second dielectric layer may be co-planar with a top surface of helmet structures. According to some embodiments, no (or at most a minimal or otherwise negligible) portion of the second dielectric layer deposits into the airgap between adjacent ones of the conductive traces. Thus, a space exists along an entire height of the conductive traces between adjacent ones of the conductive traces that is devoid of material. By keeping the spaces between adjacent ones of the conductive traces free of material, the parasitic capacitance between adjacent ones of the conductive traces is minimized since air (or vacuum) has a very low dielectric constant of about 1.0.

Figure 7:
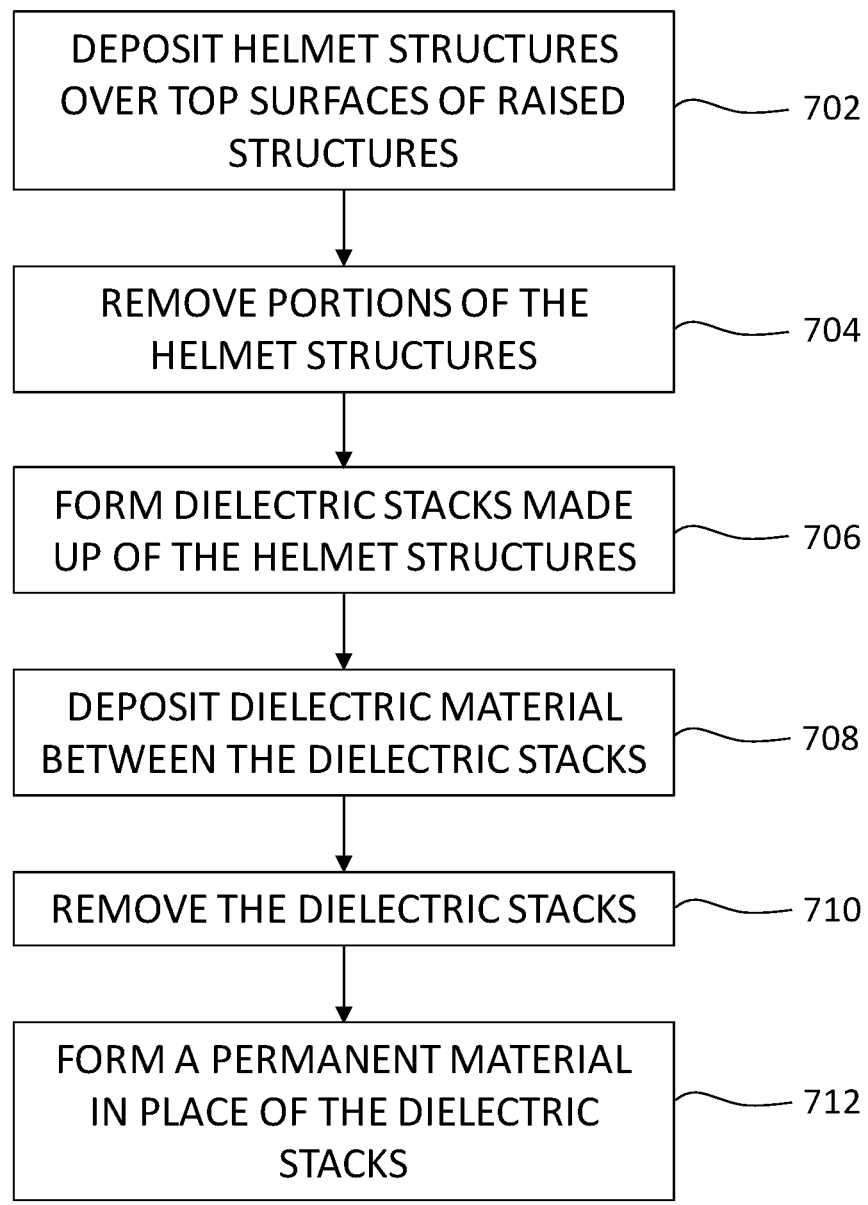
FIG. 7 is a flowchart of a fabrication process for another example interconnect structure configured with elongated conductive or insulative features, in accordance with an embodiment of the present disclosure.

FIG. 7 is a flow chart of a method 700 for fabricating an interconnect structure, according to an embodiment. Various operations of method 700 may be illustrated in the embodiment of FIGS. 3A-3G or the embodiment of FIGS. 4A-4H. However, the correlation of the various operations of method 700 to the specific components illustrated in FIGS. 3A-3G or FIGS. 4A-4H is not intended to imply any structural and/or use limitations. Rather, FIGS. 3A-3G and FIGS. 4A-4H provide example embodiments of method 700. Other operations may be performed before, during, or after any of the operations of method 700.

Method 700 begins at operation 702 where helmet structures are deposited over top surfaces of raised structures. In some embodiments, the helmet structures are deposited directly on the top surfaces of the raised structures. A single helmet structure may be deposited over one of the raised structures. According to some embodiments, the helmet structures include a dielectric material and are deposited using a selective PVD or CVD process. In some examples, the helmet structures include titanium nitride or amorphous silicon or other suitable material, as will be appreciated in light of this disclosure. The selective deposition technique is used to maximize the deposition of the helmet structures over the top surfaces of the raised structures.

In some embodiments, the raised structures are conductive traces that extend above a surface of a lower dielectric layer. In still other embodiments, the raised structures are ridges of a dielectric layer that extend above conductive traces formed within trenches in the dielectric layer.

Method 700 continues with operation 704 where portions of the helmet structures are removed. According to some embodiments, a width of the helmet structures is reduced using an angled etching process. The width of the helmet structures may be reduced to be substantially the same width (e.g., within less than 5 nm) as the underlying raised structures, according to some such embodiments. Any reactive ion tool may be used to provide the angled etch, with the etch angle being anywhere between 5 degrees and 30 degrees, according to some such embodiments. As previously explained, the angled etch can be applied in one, two, or multiple directions so as to reduce the of the helmet structures.

Method 700 continues with operation 706 where high-aspect ratio dielectric stacks are formed. The dielectric stacks are made up of helmet structures that have been repeatedly deposited and etched using the angled etch process. Accordingly, operations 702 and 704 may be repeated any number of times to form dielectric stacks that include any number of helmet structures. The angled etching process to the helmet structures allows for tall, thin structures (i.e., high-aspect ratio structures) to be made.

Method 700 continues with operation 708 where dielectric material is deposited between the high-aspect ratio dielectric stacks. The dielectric material may be deposited such that it is at least as thick as the height of the dielectric stacks. A polishing process such as, for example, CMP may be used to planarize the top surface of the dielectric material and to expose the top surfaces of the dielectric stacks. The dielectric material may be any suitable ILD material and deposited using any suitable deposition process (e.g., CVD process) to ensure complete coverage between the dielectric stacks. In some embodiments, the dielectric material is a different material than the dielectric stacks.

Method 700 continues with operation 710 where the dielectric stacks are removed to form openings through a thickness of the surrounding dielectric material. In some embodiments, the openings expose at least a portion of the top surfaces of the underlying conductive traces. In some other embodiments, the openings are aligned between adjacent ones of the underlying conductive traces. In some embodiments, a wet etching processes may be used to selectively remove the dielectric stacks while providing minimal etching to the surrounding dielectric material. For example, wet etchants that include hydrogen peroxide may be used to selectively remove titanium nitride dielectric stacks from the surrounding silicon oxide dielectric material. Dry etching may be performed as well using gas chemistries to selectively remove the dielectric stacks.

Method 700 continues with operation 712 where a permanent material is formed in place of the removed dielectric stacks. In some embodiments, the permanent material is a conductive material that contacts the lower conductive traces, thus forming high-aspect ratio conductive lines. In some other example embodiments, the permanent material is a second dielectric material that is different from the surrounding dielectric material. The second dielectric material may act as a hard mask for a subsequent etching procedure to expose underlying conductive traces.

Example Electronic Device

Figure 8:
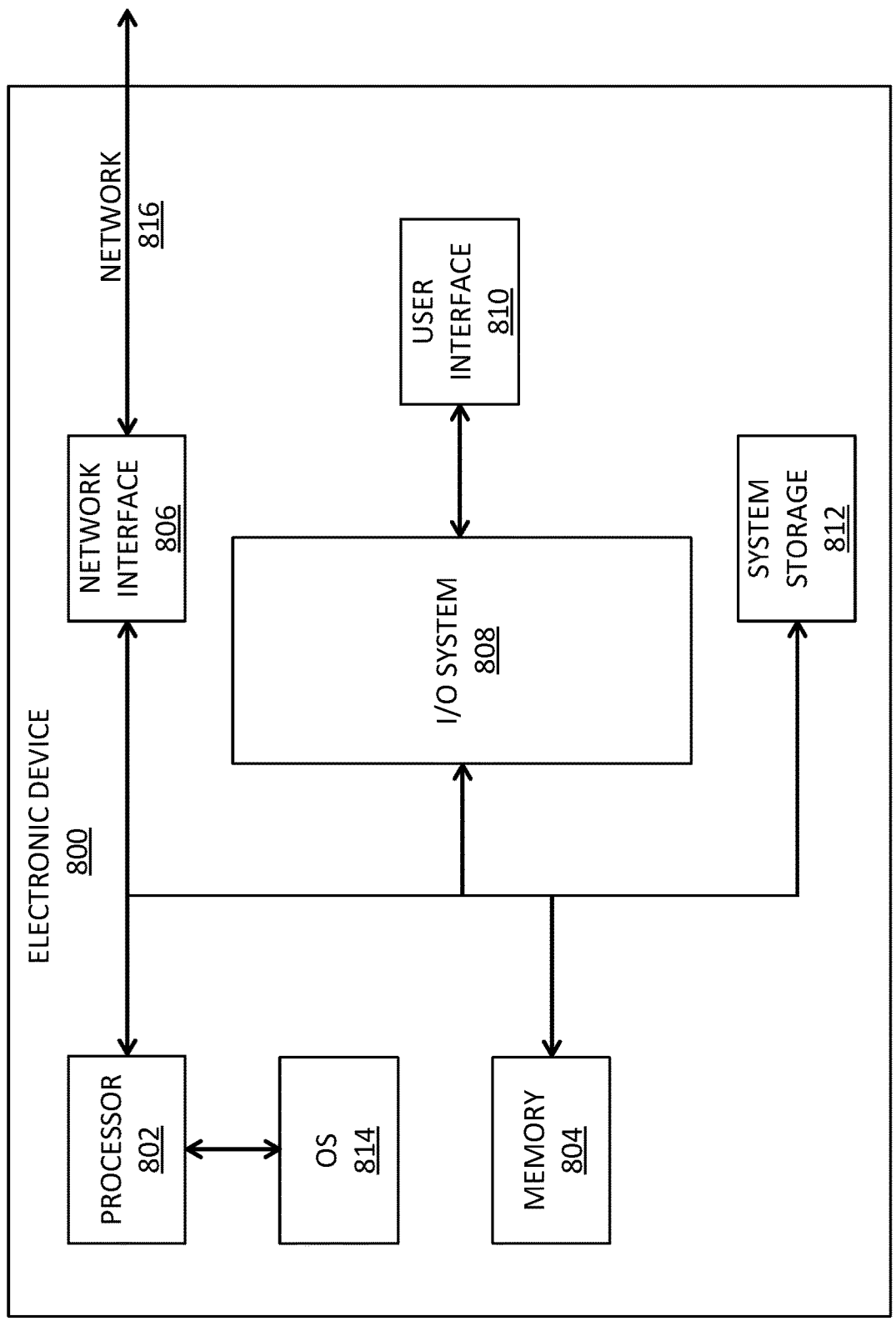
FIG. 8 illustrates an example electronic device that can include one or more of the embodiments of the present disclosure.

FIG. 8 illustrates an example electronic device 800 that may include one or more ICs having interconnect structures such as any of the embodiments disclosed herein. In some embodiments, electronic device 800 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 800 may comprise any combination of a processor 802, a memory 804, a network interface 806, an input/output (I/O) system 808, a user interface 810, and a storage system 812. As can be further seen, a bus and/or interconnect is also provided to allow for communication between the various components listed above and/or other components not shown. Electronic device 800 can be coupled to a network 816 through network interface 806 to allow for communications with other computing devices, platforms, or resources. Other componentry and functionality not reflected in the block diagram of FIG. 8 will be apparent in light of this disclosure, and it will be appreciated that other embodiments are not limited to any particular hardware configuration.

Processor 802 can be any suitable processor and may include one or more coprocessors or controllers to assist in control and processing operations associated with electronic device 800. In some embodiments, processor 802 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 804 can be implemented using any suitable type of digital storage including, for example, flash memory and/or random access memory (RAM). In some embodiments, memory 804 may include various layers of memory hierarchy and/or memory caches. Memory 804 may be implemented as a volatile memory device such as, but not limited to, a RAM, dynamic RAM (DRAM), or static RAM (SRAM) device. Storage system 812 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 812 may comprise technology to increase the storage performance enhanced protection for valuable digital media when multiple hard drives are included.

Processor 802 may be configured to execute an Operating System (OS) 814 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 806 can be any appropriate network chip or chipset which allows for wired and/or wireless connection between other components of electronic device 800 and/or network 816, thereby enabling electronic device 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 808 may be configured to interface between various I/O devices and other components of electronic device 800. I/O devices may include, but not be limited to, a user interface 810. User interface 810 may include devices (not shown) such as a display element, touchpad, keyboard, mouse, and speaker, etc. I/O system 808 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 802 or any chipset of electronic device 800.

It will be appreciated that in some embodiments, the various components of the electronic device 800 may be combined or integrated in a system-on-a-chip (SoC) architecture. In some embodiments, the components may be hardware components, firmware components, software components or any suitable combination of hardware, firmware or software. In some embodiments, any one of the described components of electronic device 800 may include one or more interconnect structures as variously disclosed herein, as part of a printed circuit board or integrated circuit chip.

In various embodiments, electronic device 800 may be implemented as a wireless system, a wired system, or a combination of both. When implemented as a wireless system, electronic device 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is an integrated circuit that includes a plurality of conductive traces arranged in a lateral sequence and above a first dielectric layer, the plurality including first and second conductive traces. A space is in part laterally between the first and second conductive traces, the first and second conductive traces each having a top surface, and the space is devoid of material. The integrated circuit also includes first and second dielectric cap structures over the respective top surfaces of the first and second conductive traces, and a second dielectric layer over and on the first and second dielectric cap structures. A bottom surface of the second dielectric layer defines a top surface of the space between the first and second conductive traces. The top surface of the space is above the top surfaces of the first and second conductive traces.

Example 2 includes the subject matter of Example 1, further comprising a conformal layer on the first and second conductive traces, wherein the conformal layer is between the first dielectric cap structure and the second dielectric, and the conformal layer is between the second dielectric cap structure and the second dielectric.

Example 3 includes the subject matter of Example 1 or 2, wherein the first and second dielectric cap structures comprise a low-k dielectric material.

Example 4 includes the subject matter of any one of Examples 1-3, wherein the first and second dielectric cap structures and the second dielectric layer each comprise the same material.

Example 5 includes the subject matter of any one of Examples 1-4, wherein the first and second dielectric layers comprise a first dielectric material and the first and second dielectric cap structures comprises a second dielectric material that is compositionally distinct from the first dielectric material.

Example 6 includes the subject matter of any one of Examples 1-5, wherein the first and second dielectric cap structures have a thickness between 5 nm and 25 nm.

Example 7 includes the subject matter of any one of Examples 1-6, wherein the first and second conductive traces are arranged such that a pitch between them is between 30 nm and 160 nm.

Example 8 includes the subject matter of any one of Examples 1-7, further comprising a device layer below the conductive traces.

Example 9 includes the subject matter of Example 8, further comprising one or more interlayer dielectric (ILD) structures above the conductive traces.

Example 10 is a computing system comprising the integrated circuit of any one of Examples 1-9.

Example 11 is a method of fabricating an interconnect structure, the method comprising: removing a portion of a first dielectric layer from laterally between adjacent ones of a plurality of conductive traces arranged in a lateral sequence, the conductive traces being over a first dielectric layer; forming dielectric helmet structures over top surfaces of the conductive traces; and forming a second dielectric layer over the dielectric helmet structures such that a bottom surface of the second dielectric layer is above the top surfaces of the conductive traces.

Example 12 includes the subject matter of Example 11, further comprising forming a conformal layer on the conductive traces before forming the dielectric cap structures.

Example 13 includes the subject matter of Example 11 or 12, wherein forming the dielectric cap structures comprises selectively depositing the dielectric cap structures using physical vapor deposition (PVD).

Example 14 includes the subject matter of Example 11 or 12, wherein forming the dielectric cap structures comprises selectively depositing the dielectric cap structures using chemical vapor deposition (CVD).

Example 15 includes the subject matter of any one of Examples 11-14, wherein forming the dielectric cap structures comprises forming dielectric cap structures comprising a low-k dielectric material.

Example 16 includes the subject matter of any one of Examples 11-15, wherein forming the dielectric cap structures comprises forming dielectric cap structures having a thickness between 5 nm and 25 nm.

Example 17 includes the subject matter of any one of Examples 11-16, wherein forming the second dielectric layer comprises forming the second dielectric layer on the dielectric cap structures such that spaces between adjacent ones of the conductive traces are devoid of material.

Example 18 is an integrated circuit that includes a plurality of conductive traces above a dielectric layer and arranged in a lateral sequence. The plurality of conductive traces includes a first conductive trace and a second conductive trace, each of the first and second traces having a first section and a second section arranged in a vertical stack. The first section is closer to the dielectric layer. The integrated circuit also includes a dielectric material adjacent to the second section of the first and second conductive traces. The dielectric material is not adjacent to the first section of the first and second conductive traces.

Example 19 includes the subject matter of Example 18, wherein the second section of the first and second traces comprises scalloped sidewall features.

Example 20 includes the subject matter of Example 18 or 19, wherein the plurality of conductive traces are arranged such that a pitch between the first and second conductive traces is between 30 nm and 160 nm.

Example 21 includes the subject matter of any one of Examples 18-20, wherein the second section has a greater height than the first section, and wherein the first section and the second section constitute an entire height of each of the first and second conductive traces.

Example 22 includes the subject matter of any one of Examples 18-21, wherein an airgap exists adjacent to the first section of the first and second conductive traces, the airgap including zero or more gases.

Example 23 includes the subject matter of Example 22, further comprising a conformal layer on the first section of the first and second conductive traces.

Example 24 includes the subject matter of any one of Examples 18-21, wherein the dielectric material is a first dielectric material, and further comprising a second dielectric material adjacent to the first section of the first and second conductive traces, the second dielectric material being compositionally distinct from the first dielectric material.

Example 25 includes the subject matter of Example 24, wherein the first dielectric material comprises silicon and nitrogen and the second dielectric material comprises silicon and oxygen.

Example 26 is an integrated circuit that includes a plurality of conductive traces above a dielectric layer and arranged in a lateral sequence. The plurality of conductive traces includes a first conductive trace and a second conductive trace, each of the first and second traces having a first section and a second section arranged in a vertical stack. The first section is closer to the dielectric layer and is configured with a linear sidewall, and the second section is configured with a non-linear sidewall that laterally extends outward or inward at one or more locations along the length of the second section. The integrated circuit also includes a dielectric material adjacent to the second section of the first and second conductive traces. The dielectric material is not adjacent to the first section of the first and second conductive traces.

Example 27 includes the subject matter of Example 26, wherein the second section of the first and second conductive traces comprises scalloped sidewall features.

Example 28 includes the subject matter of Example 27, wherein the scalloped sidewall features include one of concave-like features or convex-like features.

Example 29 includes the subject matter of Example 27 or 28, wherein the scalloped sidewall features include one of inward-facing dimples or outward facing protuberances.

Example 30 includes the subject matter of any one of Examples 26-29, wherein the non-linear sidewall of the second section laterally further extends outward or inward at one or both of its bottom surface that interfaces with the first section and its top surface.

Example 31 includes the subject matter of any one of Examples 26-30, wherein the plurality of conductive traces are arranged such that a pitch between the first and second traces is between 30 nm and 160 nm.

Example 32 includes the subject matter of any one of Examples 26-31, wherein the second section has a greater height than the first section, and wherein the first section and the second section constitute an entire height of the plurality of conductive traces.

Example 33 includes the subject matter of any one of Examples 26-32, wherein an airgap exists adjacent to the first section of the plurality of conductive traces, the airgap including zero or more gases.

Example 34 includes the subject matter of Example 33, further comprising a conformal layer on the first section of the first and second conductive traces, such that the conformal layer is between the airgap and the first section.

Example 35 includes the subject matter of any one of Examples 26-34, wherein the dielectric material is a first dielectric material, and further comprising a second dielectric material adjacent to the first section of the plurality of conductive traces, the second dielectric material being compositionally distinct from the first dielectric material.

Example 36 includes the subject matter of Example 35, wherein the first dielectric material comprises silicon and nitrogen and the second dielectric material comprises silicon and oxygen.

Example 37 includes the subject matter of any one of Examples 26-36, wherein the first section comprises a first conductive material, and the second section comprises a second conductive material compositionally distinct from the first conductive material.

Example 38 is a method of fabricating an interconnect structure, the method including: depositing a plurality of dielectric helmet structures on top surfaces of a plurality of raised structures, the plurality of dielectric helmet structures comprising a first material; removing portions of the plurality of dielectric helmet structures, such that a total width of each of the plurality of dielectric helmet structures is reduced; repeating the depositing and removing operations to form a plurality of dielectric stacks, each of the dielectric stacks comprising a plurality of dielectric helmet structures; depositing a dielectric material between adjacent ones of the plurality of dielectric helmet stacks, the dielectric material comprising a second material different from the first material; removing the plurality of dielectric helmet stacks; and depositing a third material different from the first and the second material in place of the plurality of dielectric helmet stacks.

Example 39 includes the subject matter of Example 38, wherein depositing the plurality of dielectric helmet structures comprises depositing the plurality of dielectric helmet structures over top surfaces of a plurality of conductive traces.

Example 40 includes the subject matter of Example 39, wherein prior to depositing the plurality of dielectric helmet structures over top surfaces of a plurality of conductive traces, the method further comprises forming a conformal layer on the plurality of conductive traces.

Example 41 includes the subject matter of any one of Examples 38-40, wherein depositing the third material comprises forming a metal in place of the plurality of dielectric stacks.

Example 42 includes the subject matter of any one of Examples 38-41, wherein depositing the dielectric material comprises forming the dielectric material over the plurality of conductive traces such that spaces between adjacent ones of the plurality of conductive traces are devoid of material.

Example 43 includes the subject matter of any one of Examples 38-42, wherein depositing the plurality of dielectric cap structures comprises depositing the plurality of dielectric cap structures on top surfaces of a first dielectric layer extending above a plurality of conductive traces.

Example 44 includes the subject matter of Example 43, wherein the dielectric material is a first dielectric material, and wherein depositing the third material comprises depositing a second dielectric material in place of the plurality of dielectric stacks, the second dielectric material being compositionally different from the first dielectric material.

Example 45 includes the subject matter of any one of Examples 38-44, wherein removing portions of the plurality of dielectric structures comprises performing angled etching of the plurality of dielectric structures, the angled etching being performed in two or more directions.

Example 46 is an integrated circuit that includes a plurality of conductive traces arranged in a lateral sequence and above a first dielectric layer, the plurality including first and second conductive traces. A dielectric material is in part laterally between the first and second conductive traces, the first and second conductive traces each having a top surface. The integrated circuit also includes first and second dielectric cap structures over the respective top surfaces of the first and second conductive traces, and a second dielectric layer over and on the first and second dielectric cap structures. A bottom surface of the second dielectric layer defines a top surface of the dielectric material between the first and second conductive traces. The top surface of the dielectric material is above the top surfaces of the first and second conductive traces.

What is claimed is:

1. An integrated circuit, comprising:
   a plurality of conductive traces arranged in a lateral sequence, the plurality of conductive traces including first and second conductive traces, wherein a space is in part laterally between the first and second conductive traces, the first and second conductive traces each having a top surface, and the space being devoid of material;
   first and second dielectric cap structures over the respective top surfaces of the first and second conductive traces; and
   a layer over and on the first and second dielectric cap structures, wherein a bottom surface of dielectric material of the layer defines a top surface of the space between the first and second conductive traces, wherein the top surface of the space is above the top surfaces of the first and second conductive traces, and wherein the layer is in contact with sidewalls of the first and second dielectric cap structures.

2. The integrated circuit of claim 1, wherein the layer is a first layer, the integrated circuit further comprising a second layer on the first and second conductive traces, wherein the second layer is between the first dielectric cap structure and the first layer, and the conformal second layer is between the second dielectric cap structure and the first layer.

3. The integrated circuit of claim 1, wherein the first and second dielectric cap structures and the layer each comprise the same dielectric material.

4. The integrated circuit of claim 1, wherein the first and the first and second dielectric cap structures comprise a dielectric material that is compositionally distinct from the first dielectric material of the layer.

5. The integrated circuit of claim 1, wherein the first and second dielectric cap structures have a thickness between 5 nm and 25 nm.

6. The integrated circuit of claim 1, wherein the first and second conductive traces are arranged such that a pitch between them is between 30 nm and 160 nm.

7. A computing system comprising the integrated circuit of claim 1.

8. An integrated circuit, comprising:
   a plurality of conductive traces above a dielectric layer and arranged in a lateral sequence, wherein the plurality of conductive traces includes a first conductive trace and a second conductive trace, each of the first and second traces having a first section and a second section arranged in a vertical stack, wherein the first section is closer to the dielectric layer;

a first dielectric material adjacent to the second section of the first and second conductive traces, wherein the first dielectric material is not adjacent to the first section of the first and second conductive traces; and a second dielectric material over the first dielectric material, the second dielectric material being compositionally distinct from the first dielectric material, wherein the second dielectric material is in contact with sidewalls of the first dielectric material.

9. The integrated circuit of claim 8, wherein the second section of the first and second traces comprises scalloped sidewall features.

10. The integrated circuit of claim 8, wherein the plurality of conductive traces are arranged such that a pitch between the first and second conductive traces is between 30 nm and 160 nm.

11. The integrated circuit of claim 8, wherein the second section has a greater height than the first section, and wherein the first section and the second section constitute an entire height of each of the first and second conductive traces.

12. The integrated circuit of claim 8, wherein a void exists adjacent to the first section of the first and second conductive traces, the void including zero or more gases.

13. The integrated circuit of claim 12, further comprising a conformal layer on the first section of the first and second conductive traces.

14. The integrated circuit of claim 8, wherein the first dielectric material comprises silicon and nitrogen and the second dielectric material comprises silicon and oxygen.

15. An integrated circuit, comprising:

a plurality of conductive traces arranged in a lateral sequence, wherein the plurality of conductive traces includes a first conductive trace and a second conductive trace, each of the first and second conductive traces having a first section and a second section arranged in a vertical stack, wherein the first section is below the second section and is configured with a linear sidewall, and the second section is configured with a non-linear sidewall that laterally extends outward or inward at one or more locations along the length of the second section;

a first dielectric material adjacent to the second section of the first and second conductive traces, wherein the first dielectric material is not adjacent to the first section of the first and second conductive traces; and a second dielectric material over the first dielectric material, the second dielectric material being compositionally distinct from the first dielectric material, wherein the second dielectric material is in contact with sidewalls of the first dielectric material.

16. The integrated circuit of claim 15, wherein the second section of the first and second conductive traces comprises scalloped sidewall features.

17. The integrated circuit of claim 15, wherein the non-linear sidewall of the second section laterally further extends outward or inward at one or both of its bottom surface that interfaces with the first section and its top surface.

18. The integrated circuit of claim 15, wherein the plurality of conductive traces are arranged such that a pitch between the first and second conductive traces is between 30 nm and 160 nm.

19. The integrated circuit of claim 15, wherein the second section has a greater height than the first section, and wherein the first section and the second section constitute an entire height of the plurality of conductive traces.

20. The integrated circuit of claim 15, wherein a void exists adjacent to the first section of the plurality of conductive traces, the void including zero or more gases.

21. The integrated circuit of claim 20, further comprising a conformal layer on the first section of the first and second conductive traces, such that the conformal layer is between the void and the first section.

22. The integrated circuit of claim 16, wherein the first dielectric material comprises silicon and nitrogen and the second dielectric material comprises silicon and oxygen.

23. The integrated circuit of claim 15, wherein the first section comprises a first conductive material, and the second section comprises a second conductive material compositionally distinct from the first conductive material.

* * * * *